(12) United States Patent
Hiatt et al.

(10) Patent No.: US 7,502,058 B2
(45) Date of Patent: Mar. 10, 2009

(54) IMAGER WITH TUNED COLOR FILTER

(75) Inventors: William M. Hiatt, Eagle, ID (US);
Ulrich C. Boettiger, Boise, ID (US);
Jeffrey A. McKee, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 879 days.

(21) Appl. No.: 10/456,585

(22) Filed: Jun. 9, 2003

(65) Prior Publication Data

US 2004/0246351 A1 Dec. 9, 2004

(51) Int. Cl.
*H04N 5/335* (2006.01)
*H04N 3/14* (2006.01)

(52) U.S. Cl. .................... 348/272; 348/294
(58) Field of Classification Search .......... 348/272, 348/294

See application file for complete search history.

(56) References Cited

U.S. PATENT DOCUMENTS

| | | | |
|---|---|---|---|
| 4,315,978 A | 2/1982 | Hartman | |
| 5,493,143 A | 2/1996 | Hokari | |
| 5,965,875 A | 10/1999 | Merrill | |
| 6,066,510 A | 5/2000 | Merrill | |
| 6,137,100 A | 10/2000 | Fossum et al. | |
| 6,160,282 A | 12/2000 | Merrill | |
| 6,297,071 B1 | 10/2001 | Wake | |
| 6,330,113 B1 | 12/2001 | Slagle et al. | |
| 6,369,853 B1 | 4/2002 | Merrill et al. | |
| 6,395,576 B1 | 5/2002 | Chang et al. | |
| 6,433,844 B2 | 8/2002 | Li | |
| 6,771,314 B1* | 8/2004 | Bawolek et al. | 348/272 |
| 7,030,918 B1* | 4/2006 | Nakashiba | 348/294 |
| 7,072,442 B1* | 7/2006 | Janik | 378/84 |
| 2001/0013898 A1* | 8/2001 | Bawolek et al. | 348/272 |
| 2002/0058353 A1 | 5/2002 | Merrill | |
| 2004/0000669 A1* | 1/2004 | Yamamura | 257/72 |
| 2005/0068436 A1* | 3/2005 | Fraenkel et al. | 348/294 |

FOREIGN PATENT DOCUMENTS

| | | |
|---|---|---|
| KR | 10-1994-0144292 | 7/1998 |
| KR | 10-1998-0064437 | 10/1998 |
| KR | 10-1997-0070054 | 8/2000 |

OTHER PUBLICATIONS

Hirayam, K.; Kaneda, K.; Yamashita, H.; Yamaji, Y.; Monden, Y., Visualization of Optical Phenomena Caused by Multilayer Films with Complex Refractive Indices, The 7th Pacific Conference on Computer Graphics and Applications, Oct. 5-7, 1999, pp. 128-137.

* cited by examiner

*Primary Examiner*—James M Hannett
(74) *Attorney, Agent, or Firm*—Dickstein Shapiro LLP

(57) ABSTRACT

An optimized color filter array is formed in, above or below a one or more damascene layers. The color filter array includes filter regions which are configured to optimize the combined optical properties of the layers of the device to maximize the intensity of the particular wavelength of light incident to a respective underlying photodiode.

48 Claims, 34 Drawing Sheets

IMAGER WITH TUNED COLOR FILTER

FIELD OF THE INVENTION

The present invention relates to improved semiconductor imaging devices and, in particular, to CMOS imagers with improved color filters, color separation and sensitivity.

BACKGROUND OF THE INVENTION

Color imaging in solid state or digital video cameras is typically performed with different types of semiconductor-based imagers, such as charge coupled devices (CCDs), complementary metal oxide semiconductor (CMOS) photodiode arrays, charge injection devices and hybrid focal plane arrays, among others.

A CMOS imager circuit generally includes an array of micro lenses, color filters and a photo imager which converts a color filtered light signal into a digital form using a read out array and digital processing. The photo imager portion of the imager includes a focal plane array of pixels, each one of the pixels including either a light sensitive area such as a photogate, photoconductor or a photodiode overlying a doped region of a substrate for accumulating photo-generated charge in the underlying portion of the substrate. A readout circuit is connected to each pixel and includes at least an output field effect transistor formed in the substrate and a charge transfer section formed on the substrate adjacent the photogate, photoconductor or photodiode having a sensing node, typically a floating diffusion node, connected to the gate of an output transistor. A device layer above or surrounding the photo sensitive regions contains wire connections to the photodiodes and some or all of the elements of a read-out circuit among other things. The imager may include at least one electronic device such as a transistor for transferring charge from the charge accumulation region of the substrate to the floating diffusion node aid one device, also typically a transistor, for resetting the node to a predetermined charge level prior to charge transference.

Color imaging photodiode systems suffer from a variety of problems. For example, light intensity losses at the photo sensitive areas area due to absorption or diffraction occur as light enters the micro lenses, passes through a color filter as well as intervening layers until incident light passes into the light sensitive area of a photodiode or photogate.

Optical distortion causing, among other things, light intensity losses result from a number of design factors. Pixel surfaces above a photodiode are constructed to include, for example, color filters for red, green, blue, or cyan, magenta or yellow, depending on technology used, which are delineated on a flat planar surface. The light received by a photodiode is influenced by the materials and depths of a substrate above the photodiode. The intensity of light which reaches a photodiode which is underneath a stack of layers on an imager device is dependent on the wavelength of the light which is transmitted through color filters and or substrates due to thin film interference effects and index of refraction changes based on the depths and materials used in the imager's substrate.

Some designs vary the distance of the photodiode from the top surface of the imager in an effort to adjust for the effects of refraction and absorption within the substrate above a photodiode. Varying the photodiode distance from the top surface of the imager greatly increases the cost of imager manufacturing. Such complexity adds to design costs and does not adequately address design limitations on the ultimate transmission of photons to the light sensitive area of a photodiode or adequately increase the maximum photon intensity which can be captured by a given photodiode. Thus, a new approach is needed which can enable simplified photodiode construction while still improving or optimizing photon transmission to various photodiodes which receive different wavelengths of light, e.g., blue, red or green.

BRIEF SUMMARY OF THE INVENTION

The present invention provides alternative processes for manufacturing color imager pixel structures for optimizing transmission of light to various photodiodes which receive different wavelengths of light such as blue, green or red. Various methods of forming a color filter array are provided which incorporate different processing schemes including a single etch, multiple etches and various color filter element formation processes including various masking procedures in conjunction with etching and forming a color filter element. A variety of approaches are used to obtain optimized transmission of light through layers of the imager including adjusting color filter windows in a damascene layer for each pixel to optimize light incident at the color filter. Another embodiment provides for extended color filter layers which rise above a device layer such that each color filter layer is optimized in dimension and possibly material for each photodiode which absorbs a particular wavelength of light (e.g., red, green, blue). Damascene layers are used which provide room in which various color filter cavities may be formed to dimensions that provide optimized optical characteristics for light absorbed by a particular photodiode. Varied color filter cavities can also be formed within the overhead portion of device layers immediately above a photodiode if sufficient headroom is available in a device layer. Various types of damascene or layer adjustments are possible including the use of encapsulation layers above and below color filter elements which adjust optical properties of the combined layers above a particular diode by changing combined layer optical properties or by moving a color filter element in relation to a particular photodiode or light sensitive region.

These and other features and advantages of the invention will be better understood from the following detailed description, which is provided in connection with the accompanying drawings.

DETAILED DESCRIPTION OF THE INVENTION

Figure 1A:
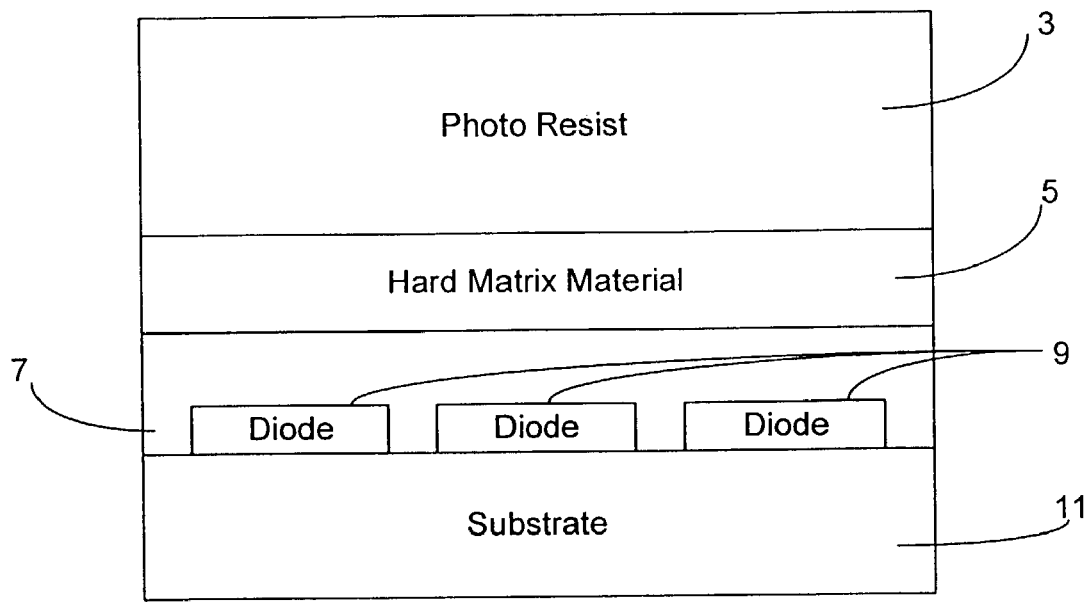
FIG. 1A shows a cross sectional view of an exemplary color pixel and filter structure before processing in accordance with one exemplary embodiment of the invention.

One aspect of the invention provides for an alternative processing scheme for forming a color filter array for imager sensors. Another aspect of the invention permits the use of current device manufacturing techniques for tuning specific areas of the substrate for maximum color transmission.

An exemplary embodiment uses a damascene type of processing to form a color pixel rather than a direct lithographic imaging of a color filter resist. Color filter array (CFA) cavities for pixels are generated by conventional lithography and etch in oxide or another suitable matrix material which are then filled with a colored material. During a subsequent chemical mechanical processing (CMP) process, all colored material will be removed except for the recessed areas, which remain filled to form the color filter portion of the pixels.

Colored material depths used in color filters can be varied to tune the optical properties of a particular photo sensitive region of the imager array. A damascene layer can be used to provide sufficient room above a diode and/or metallization layer above a diode so that the optical properties of the layers above the diode can be varied in order to optimize incident light at the diode for a particular wavelength. A damascene layer may not be required when there is sufficient headroom for a color filter cavity to extend into the layer above the photodiode if needed for optical property adjustment.

Recessed areas in a damascene layer and possibly other layers above a photodiode create a color filter array (CFA) window or filter section above a photodiode as well as portions of the substrate, including a device stack and damascene layers. The use of a CFA window to alter the collective thin film interference, refractive and absorptive properties of the various materials above the photodiode increases the maximum intensity of a particular wavelength range of light which is received at the photodiode. Also, a high resolution and print quality can be obtained from a pixel incorporating an optimized CFA window as high resolution standard resists can be used with standard lithography technology, unlike lithographic formation of color pixels using direct color resist imaging. Also, color material applied with standard coating technology and using a damascene style structure and a CFA window does not have to be imagable, and therefore provides a much larger freedom in chemical formation and material constraints. Also, thinner color films can be used with higher pigment loading, which improves optics of some imager designs. Moreover, use of the invention permits fully planarized color matrix structures despite the ability to adjust damascene and CFA window layer thickness' for each color individually. Problems such as color streaking due to topography of previous colors adversely affecting another pixel structure are avoided. Optical cross talk can also be reduced due to shallower overall film stacks and thus aspects of the invention offers an option to increase separation or create a separation matrix between pixels. An aspect of the invention also prevents color residues on neighboring pixels and offers lower cost color materials for fabrication of the CFA. Also, the invention permits the elimination of a need for isolated photo fabrication areas which is currently required due to resist contamination with mobile ions caused by conventional CFA fabrication processes. Lastly, the invention offers a built-in lens above or underneath the color pixel without the need for an additional planarizing coat. The invention also permits a wide variety of structures which afford the requisite "tuning" of the collective refractive and absorptive properties of the layers above a photodiode.

Modeling of the thin film interference, refractive and absorptive properties of all layers above a photodiode of an imager is accomplished to begin analysis of wavelength tuning which will be required. Modeling of refractive and absorptive properties of photodiode and imager layers is well known in the art. For example, commercial software such as MathCAD, Prolith or SolidC are available which calculates multiple reflectivities and absorption of multiple films sitting on top of each other. Commercial lithography software can also be used. A designer inputs the basic optical parameters of the various films, then the software outputs the fraction that is absorbed, as well as how much is reflected and how much is absorbed. Manual calculations can be used as well employing software applications using Snells refractive equation, Fresnel's equations as well as Beer Lambert equations which discuss bulk absorption of films, which have an exponential relationship where absorption increases exponentially as thickness increases.

Generally, a variety of solutions are determined and an optimum choice is selected. After determining the optimum set of layers, including the variable CFA window dimensions as well as materials if need be, then one of a number of etching approaches is applied and a color pigment filler is placed within the CFA window cavity. In some exemplary embodiments, different CFA window dimensions and material for use in the CFA window cavity may be used to optimize reflectivity and absorption properties of an imager stack above the photosensitive area of a diode. Providing for the use of a damascene layer, as well as variable depth CFA window through a damascene, and in some cases, the device layer of an imager above a diode and underneath the damascene layer, permits the creation of the CFA window of various dimensions which optimize reflectivity and other optical properties of an imager. In other words, a CFA window, or the cavity with color filler, may extend through a portion of the damascene layer as well as, in some cases, into the substrate stack leading down to the photodiode. CFA windows can be used with complementary colors photodiode assemblies as well. Determination of thickness of a particular CFA window and underlying layer(s) above an underlying photodiode is dependent on, among other things, the color filter used on top of the photodiode and refractive index of the combined stack including the CFA window, and all other layers above the photodiode, through which incident photons must pass. The thickness of a particular CFA window can also be based in part on a micro lens which is used with a pixel or imager assembly in order to adjust for optical focus or other lens attributes. A CFA window can also be used which extends above a device layer or damascene layer as well, rather than down into a damascene or device layer. A designer can determine an optimal thickness using a computer or manual interference, refractive or absorptive model of a given stack or set of layers above a photodiode to maximize intensity of light arriving at the photodiode.

A first embodiment can be created with photosensitive color materials to form differently colored pixels inside a previously defined hard matrix material which is above photodiodes of a color pixel. The hard matrix material is etched to open all three CFA cavities for the color filter material. Each color can be added sequentially by coating the full wafer with the selected color and imaging it with a mask pattern that removes the unwanted color material in the previously defined cavities in a develop step. After two colors have been imaged, the third pixel type can be formed by coating the third color and polishing the wafer, without an additional imaging step, until three separately colored pixels remain in the cavities of the matrix.

Figure 1B:
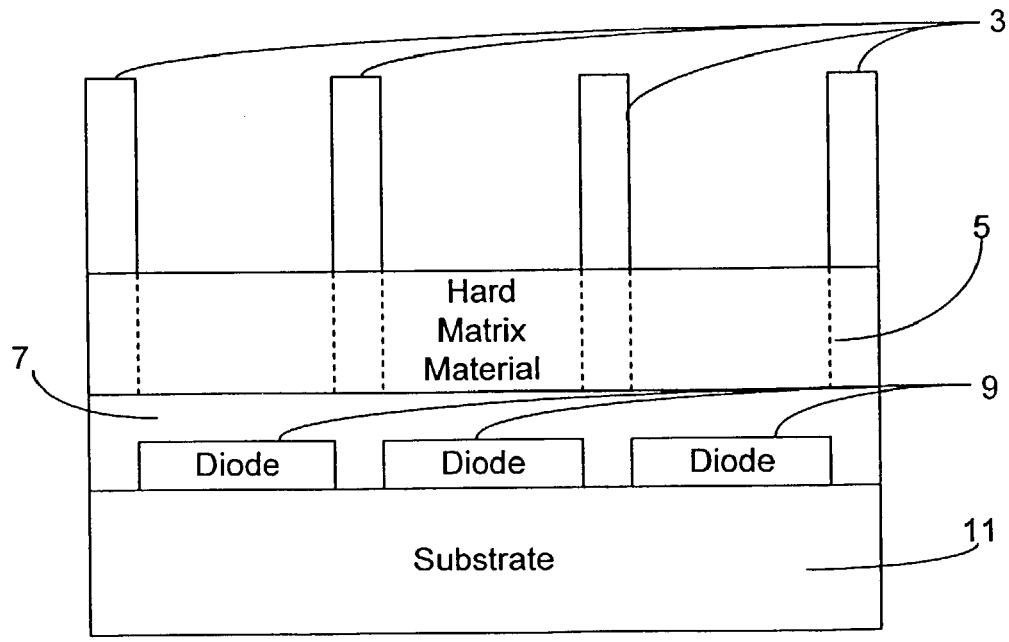
FIG. 1B shows a cross sectional view of the FIG. 1A color pixel and filter at a state of processing subsequent to that shown in FIG. 1A.
Figure 1C:
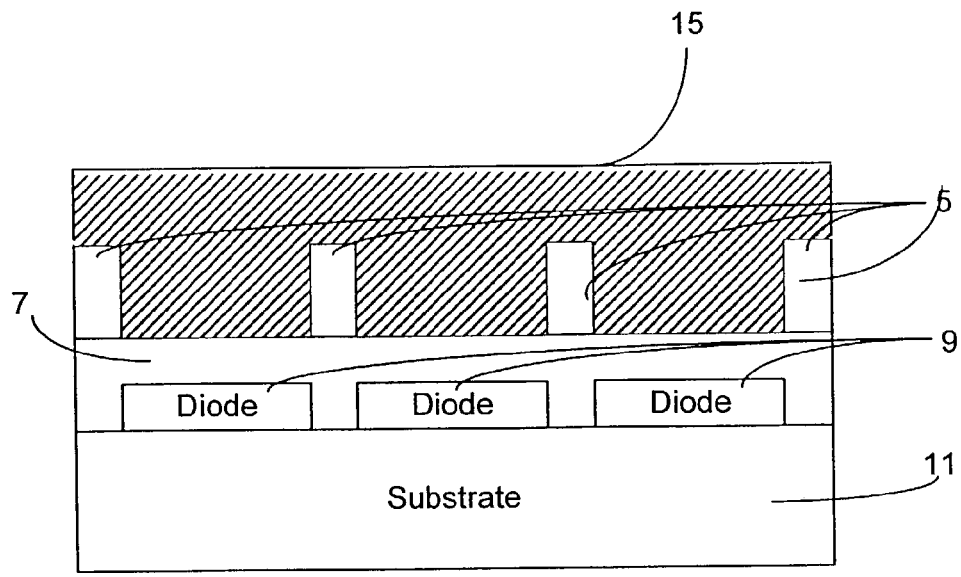
FIG. 1C shows a cross sectional view of the FIG. 1A color pixel and filter at a state of processing subsequent to that shown in FIG. 1B.
Figure 1D:
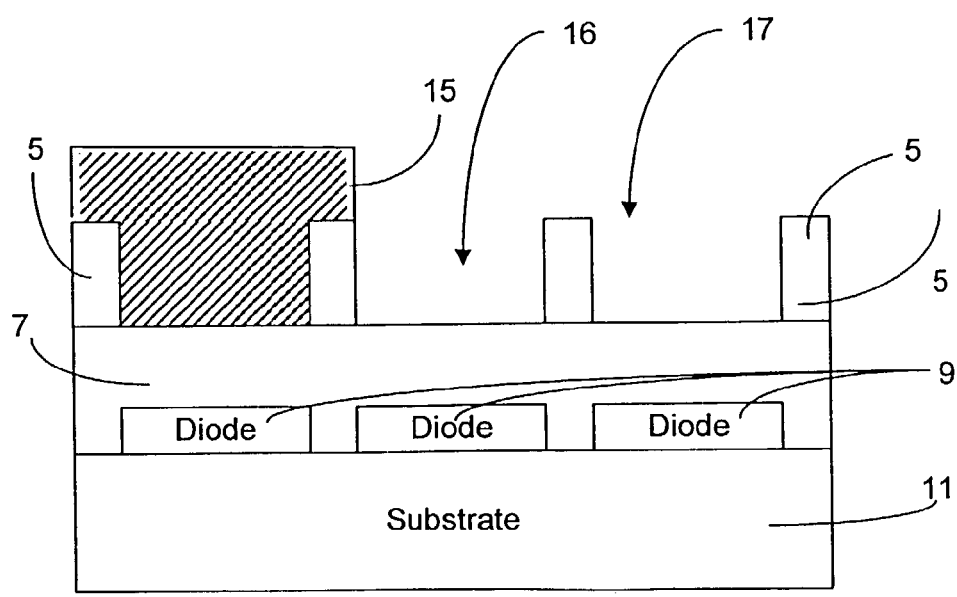
FIG. 1D shows a cross sectional view of the FIG. 1A color pixel and filter at a state of processing subsequent to that shown in FIG. 1C.
Figure 1E:
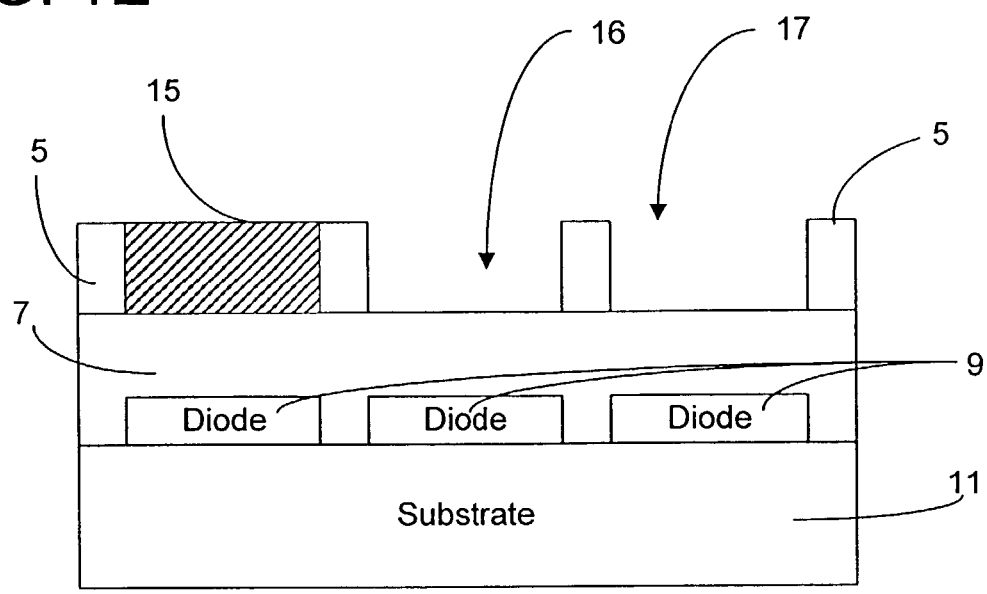
FIG. 1E shows a cross sectional view of the FIG. 1A color pixel and filter at a state of processing subsequent to that shown in FIG. 1D.
Figure 1F:
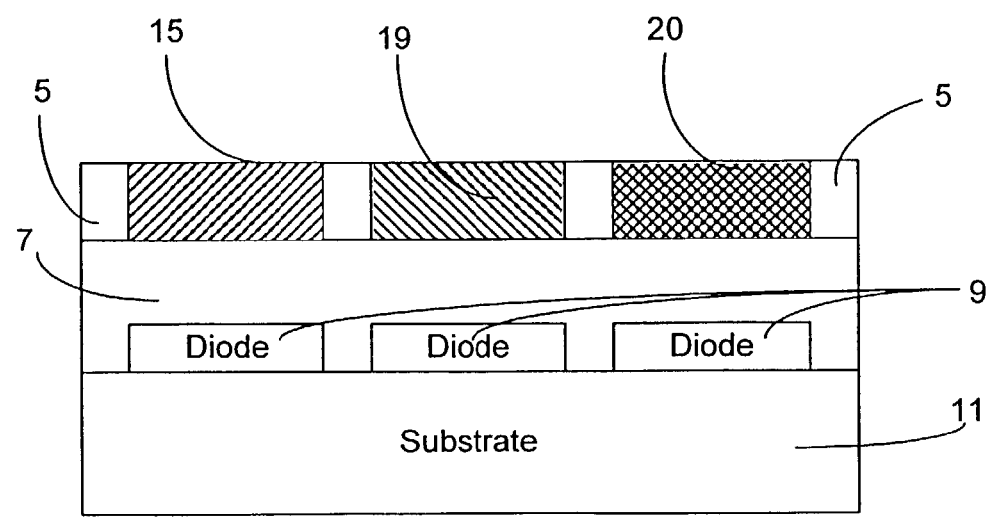
FIG. 1F shows a cross sectional view of the FIG. 1A color pixel and filter at a state of processing subsequent to that shown in FIG. 1E.

Referring to FIG. 1A, the first embodiment begins with a plurality of photodiodes 9 formed on a substrate 11. A region 7 comprising oxide and metal layers are formed on and around photodiodes 9. A hard matrix material layer 5 is formed above the oxide and metal layers 7. A layer of photo resist 3 is formed above the matrix material layer 5. Referring to FIG. 1B, the photo resist layer 3 is imaged and cavities are made in the photo resist layer above photodiodes 9 using a standard resist process. Referring to FIG. 1C, the matrix material layer 5 is etched, remaining photo resist 3 is stripped and a first photo sensitive color coating 15 is applied (e.g. a red color coating) into the cavities in matrix layer 5. The photo sensitive color coating 15 is exposed and developed to remove color coating from cavities 16, 17 which are to receive other color coatings. Referring to FIG. 1E, chemical and mechanical polishing (CMP) is accomplished on the applied 15 to bring the coating 15 level with the matrix layer 5. Referring to FIG. 1F, the process of application of color, stripping the color from cavities (i.e., 16, 17) which are to receive another color coating (i.e., 19, 20), then CMP processing, is repeated until all coating layers 15, 16 and 17 are applied and the coatings processed.

Figure 10:
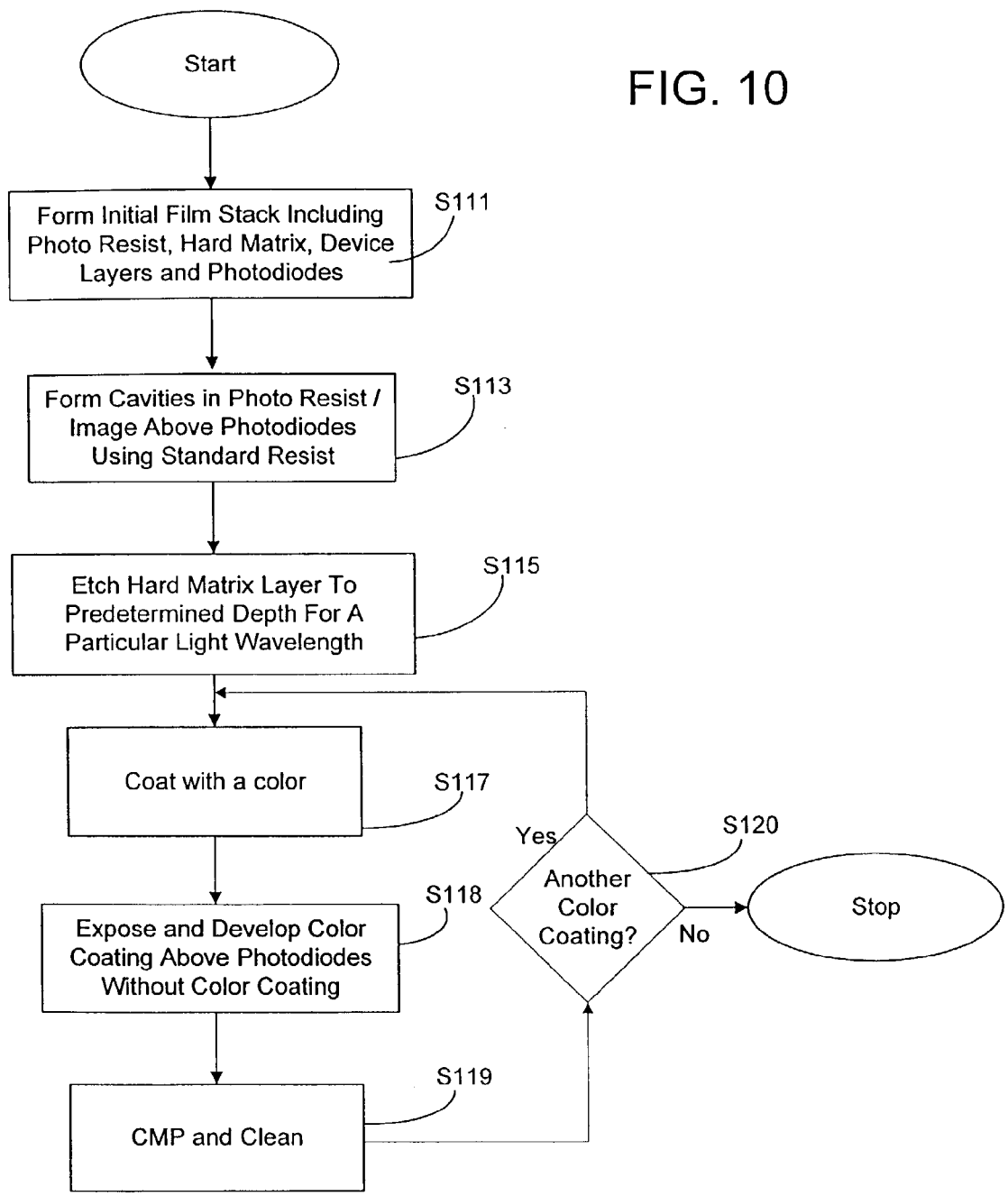
FIG. 10 shows a processing sequence for manufacturing a color pixel and filter element in accordance with an exemplary embodiment the of invention.

Referring to FIG. 10, one exemplary process for manufacturing an embodiment of the FIG. 1F pixel structure is shown. At processing segment S111, an initial film stack is formed including a substrate 11, photodiodes 9 formed on the substrate 11, a device layer 7 around the photodiodes 9, a hard matrix material 5 above the device layer 7 and a photo resist layer 3 formed above the hard matrix material 5. At processing segment S113, cavities are formed in the photo resist layer 3 by imaging above all of the photodiodes 9 using a standard resist. At processing segment S115, the hard matrix layer 5 underneath the previously formed cavity is etched and stripped. At processing segment S117, a photosensitive color coating 15 (e.g., red) is applied over remaining hard matrix layer 5 and into the previously formed cavities. At processing segment S118, the color coating 15 is exposed and developed to remove color coating 15 and form cavities 16, 17 (FIG. 1D) over two of the three photodiodes 9. At processing segment S119, CMP and cleaning is accomplished to remove remaining color material 15 above the level of the hard matrix material 5. At processing segment S120, it is determined if another color coating is required. If another color coating is required, then a different photo sensitive color coating 19 (e.g., green or blue) is applied over remaining hard matrix layers 5, layer 15 and into cavities 16, 17 at step S117. Then, at processing segment 109, the photo sensitive color coating 19 is exposed and developed above the photodiodes 9 without a color coating. At processing segment S119, the color coating applied at processing segment S118 is processed by CMP and cleaned so that the top surface of color coating 19 is even with the remaining hard matrix layer 5. At processing segment S120, another determination is made as to whether or not another color coating is required. If another color coat is required, then processing segments S117 through S119 are repeated using another photo sensitive color coating (e.g., 20 FIG. 1F). If, at processing segment S120, it is determined that no further color coatings are required, processing terminates.

A second embodiment of the invention is formed with separate hard matrix etches for each color and uses three separate cavities, one per color, that are used to open and fill holes in the matrix material 5 by three sequential photo, etch, coat and polish steps. For each color, a coating is applied to a wafer with standard photo resist, imaging it with a lithography tool to remove the resist in the intended pixel areas and etching the open areas in a dry etch tool. The wafer then gets coated with color resist and the remaining resist, except the color in etched areas, is removed. Additional cavities are formed in the hard matrix then a color coating is applied, then removed in the manner described above until all color filters are formed.

Figure 2A:
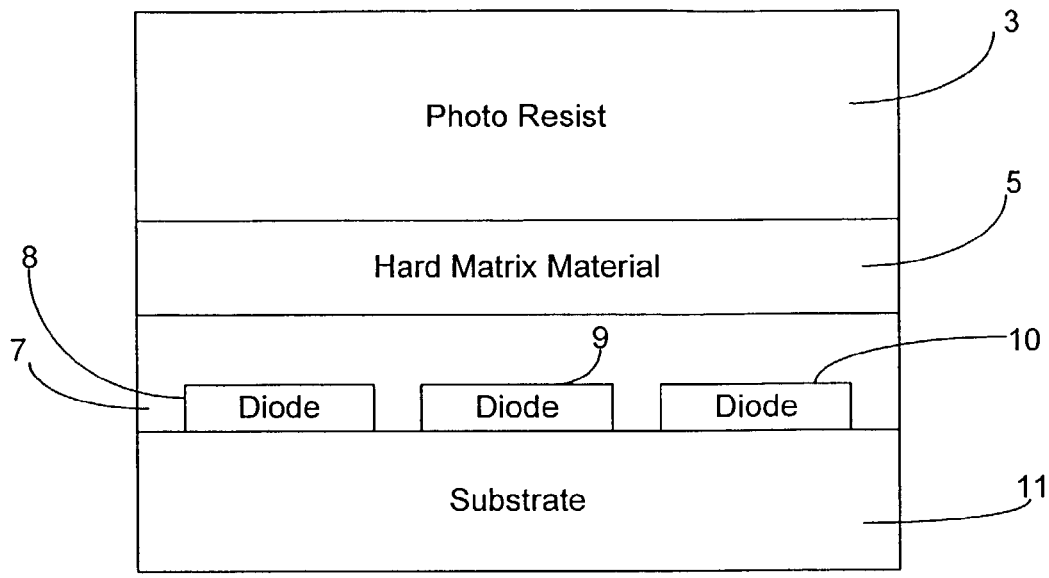
FIG. 2A shows a cross sectional view of an exemplary color pixel and filter structure before processing in accordance with one exemplary embodiment of the invention.
Figure 2B:
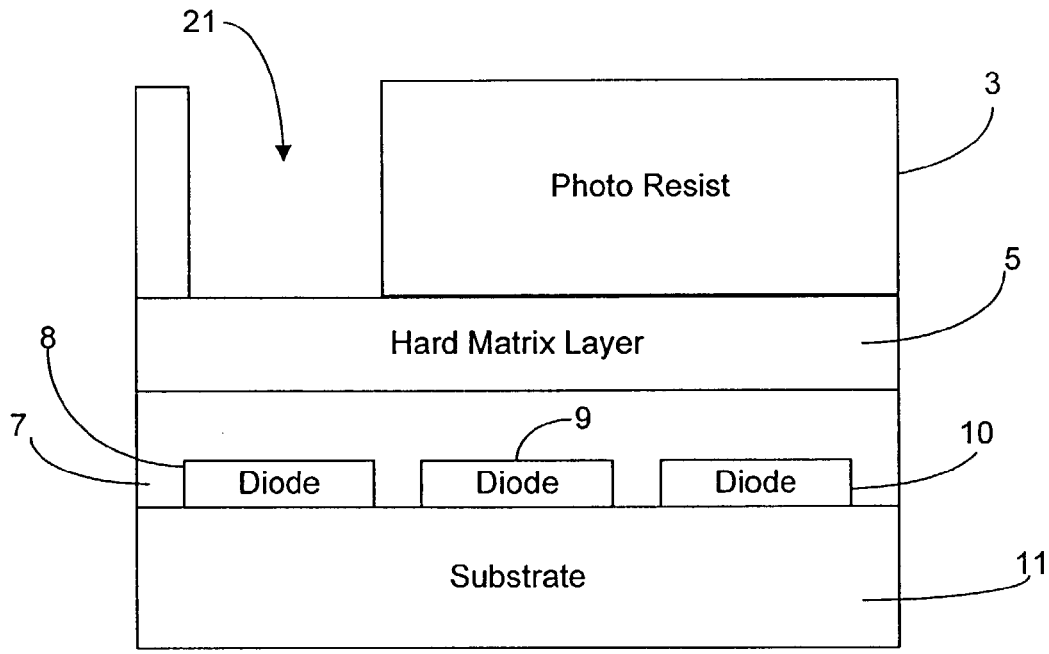
FIG. 2B shows a cross sectional view of the FIG. 2A color pixel and filter at a state of processing subsequent to that shown in FIG. 2A.
Figure 2C:
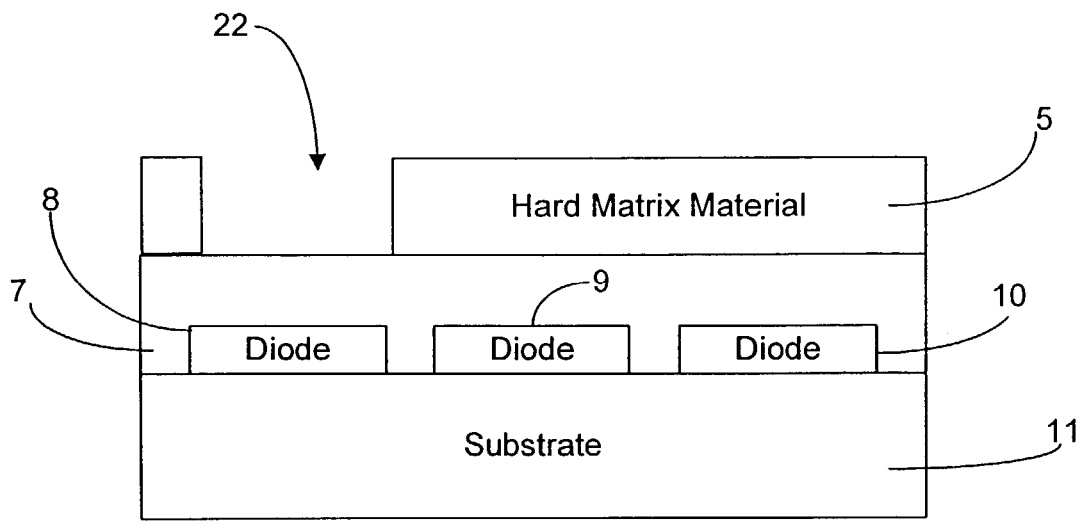
FIG. 2C shows a cross sectional view of the FIG. 2A color pixel and filter at a state of processing subsequent to that shown in FIG. 2B.
Figure 2D:
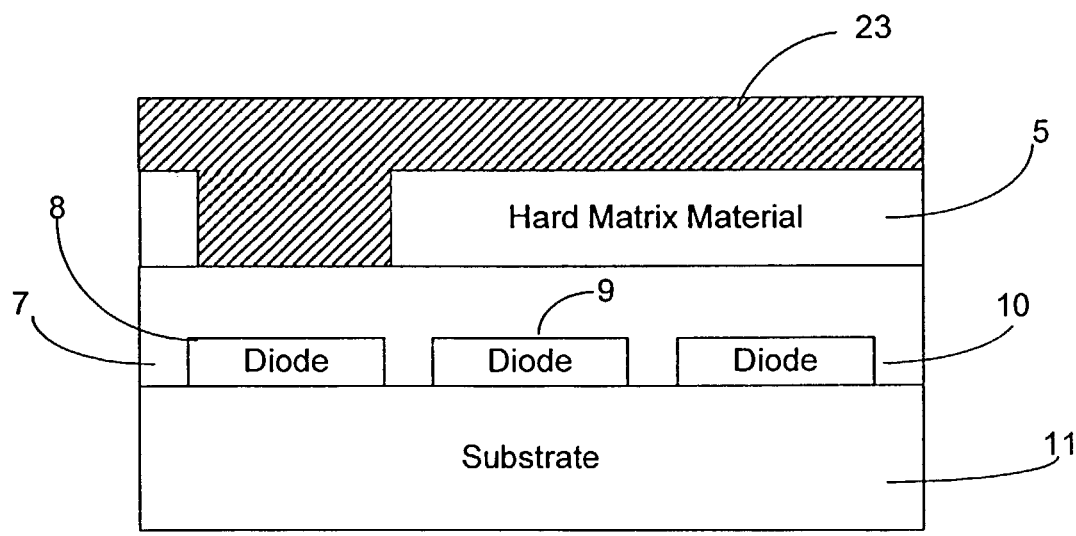
FIG. 2D shows a cross sectional view of the FIG. 2A color pixel and filter at a state of processing subsequent to that shown in FIG. 2C.
Figure 2E:
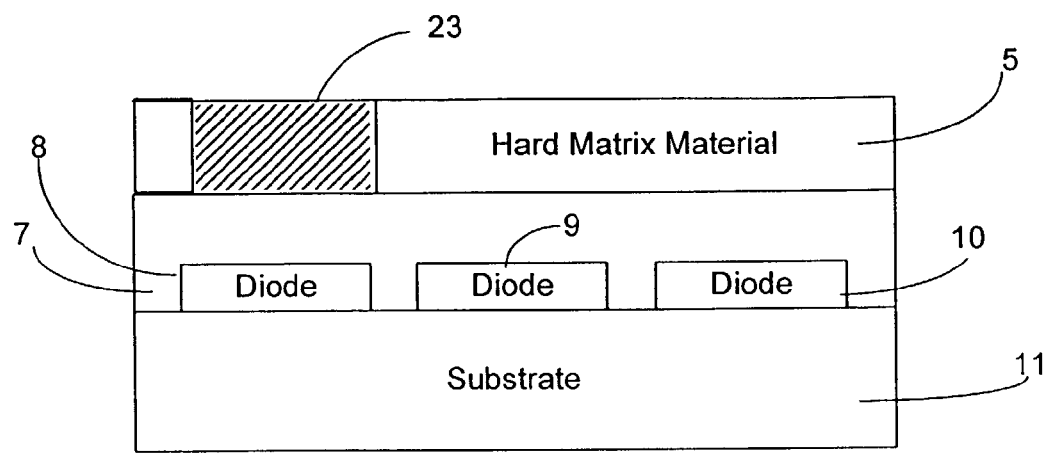
FIG. 2E shows a cross sectional view of the FIG. 2A color pixel and filter at a state of processing subsequent to that shown in FIG. 2D.
Figure 2F:
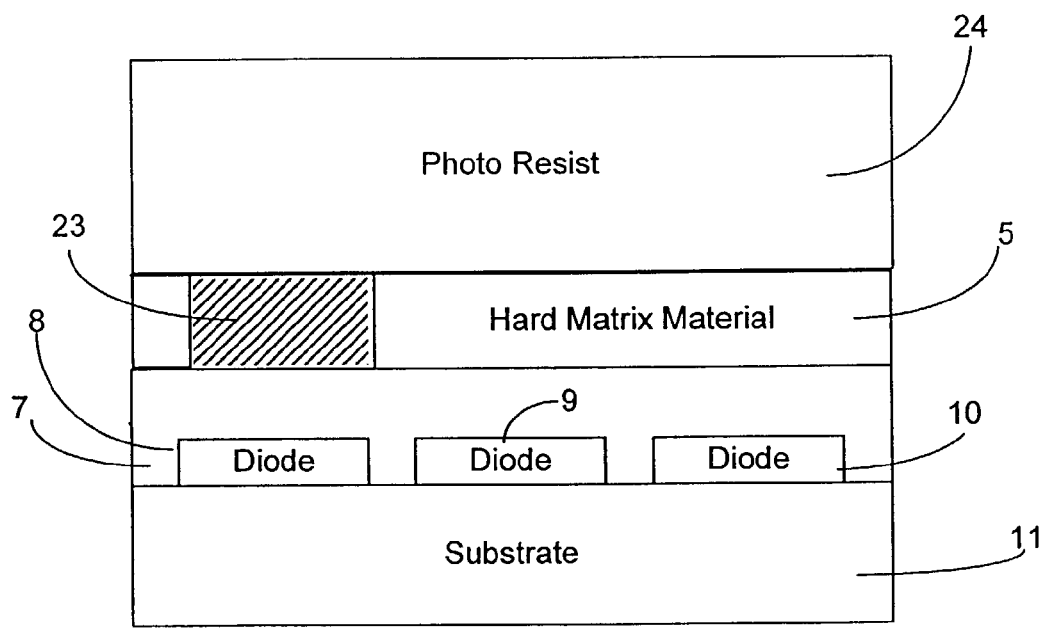
FIG. 2F shows a cross sectional view of the FIG. 2A color pixel and filter at a state of processing subsequent to that shown in FIG. 2E.
Figure 2G:
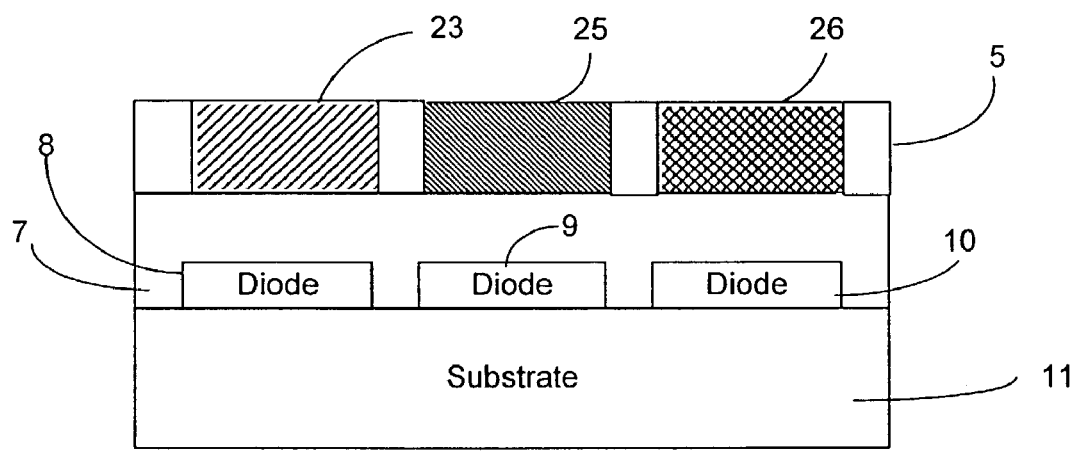
FIG. 2G shows a cross sectional view of the FIG. 2A color pixel and filter at a state of processing subsequent to that shown in FIG. 2F.

Referring to FIG. 2A, the second embodiment begins to be formed with photodiodes 8, 9 and 10 on a substrate 11. Region 7 comprising oxide and metal layers is formed on and around photodiodes 8, 9 and 10. A hard matrix material layer 5 is formed above the oxide layer 7. A layer of photo resist 3 is formed above the matrix material layer 5. Referring to FIG. 2B, the photo resist layer 3 is imaged and a cavity 21 is made in the photo resist layer 3 above a photodiode 8 using a standard resist process. As shown in FIG. 2C, the matrix material layer 5 is etched to form a cavity 22 and the photo resist is stripped. Referring to FIG. 2D, a first photo sensitive color coating 23 is applied (e.g. a red color coating) into cavity 22 and on top of matrix layer 5. Referring to FIG. 2E, chemical and mechanical polishing (CMP) is accomplished on the applied color coat 23 to bring the coating 23 level with the matrix layer 5. Referring to FIG. 2F, a photo resist layer 24 is applied to the top of remaining color coating 23 and matrix layer 5. The process of a separate matrix etch for each color (e.g., 26 then 27) is repeated to produce a resulting exemplary embodiment as shown in FIG. 2G. FIG. 2G shows depths of color coatings 23, 35 and 26 to be uniform. It should understood that color coating (e.g., 23, 25 or 26) depths can be varied to selectively adjust the combined optical properties of layers above a respective photodiode 8, 9 or 10.

Figure 11:
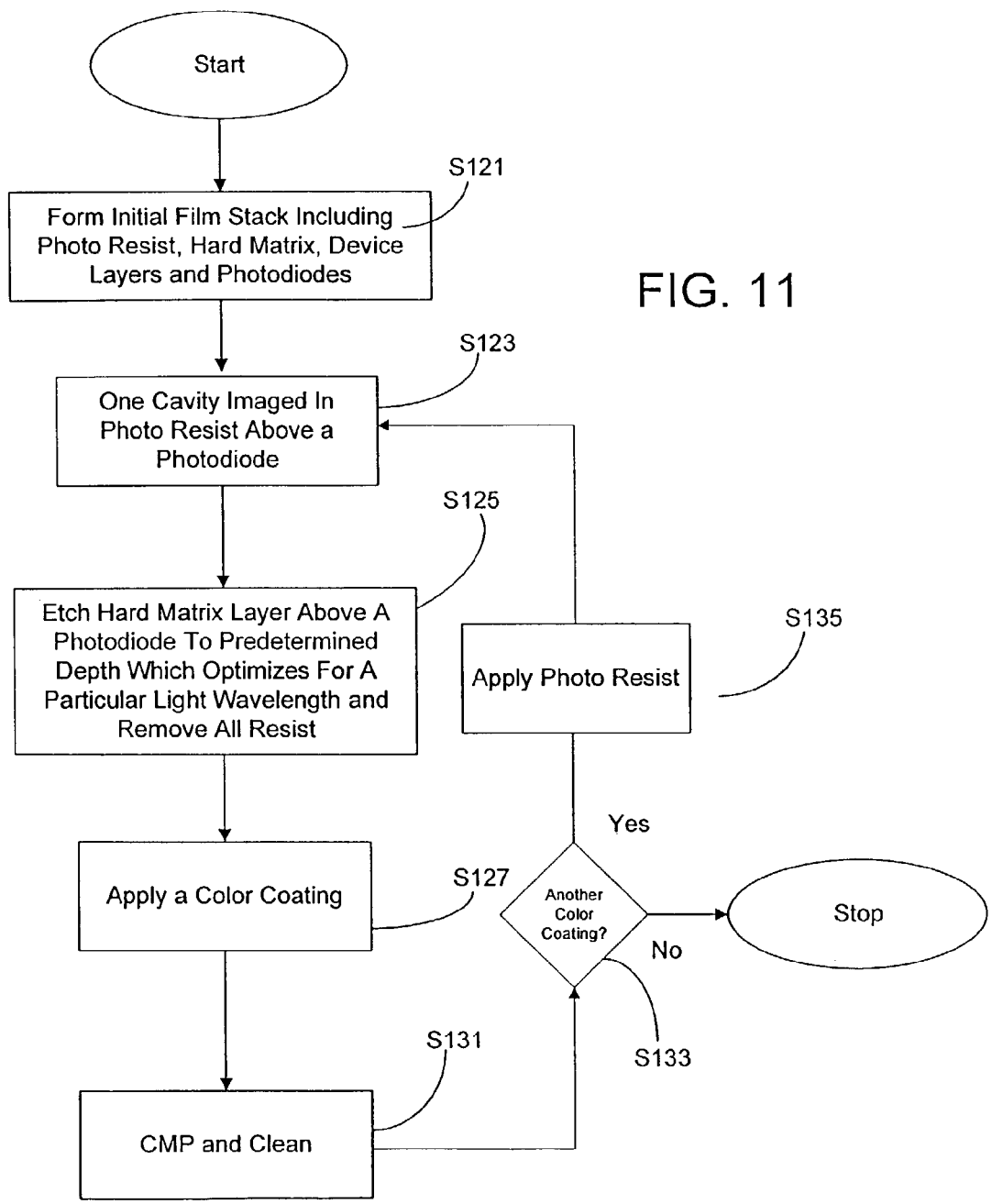
FIG. 11 shows a processing sequence for manufacturing a color pixel and filter element in accordance with an exemplary embodiment of the invention.

Referring to FIG. 11, one exemplary process for manufacturing an exemplary embodiment of the FIG. 2F structure using a single matrix etch per color is shown. At processing segment S121, an initial film stack is formed including a substrate 11, photodiodes 8, 9, 10 formed on the substrate 11, a device layer 7 around the photodiodes (8, 9, 10), a hard matrix material 5 above the device layer 7 and a photo resist layer 3 formed above the hard matrix material 5. At processing segment S123, a cavity 21 (FIG. 2B) above a photodiode 8 is imaged in the standard resist 3. At processing segment S125, the hard matrix layer 5 below cavity 21 (FIG. 2B) and photodiode 8 is etched and stripped to form a cavity 22 (FIG. 2C) in the matrix layer 5. At processing segment S127, a color coating 23 (FIG. 2D) (e.g, red, green or blue) is applied over matrix layer 5 and in cavity 22. At processing segment S131, the color coating 23 above the level of the matrix layer 5 is removed using a method such as CMP. A determination of whether or not another color coating is needed is made at processing segment S133. If another color coating is needed, then photo resist 24 will be applied on top of the previously applied color material (e.g., FIG. 2F, 23) and the remaining hard matrix material 5. Then processing continues from processing segment S123 to create a cavity in photo resist (e.g., 24), create a cavity in hard matrix material over a photodiode (e.g., 9 or 10), apply a different color coating (e.g., green or blue), following removal of color coating above the level of the matrix layer 5. Another determination is made of whether or not another color coating is required at processing segment S133. If another color coat is required, then processing commences at processing segment S135 through segment S131. If another color coating is not required at processing segment S133, then processing stops.

A third embodiment provides for imaging and etching cavities into the hard matrix for all pixels at once with a common depth for all colors. The wafer is then coated with photo resist and one cavity is exposed and developed. The wafer is coated with a color then the unwanted portions of the color removed. Another layer of photo resist is applied over a pixel then removed from the next cavity over a photodiode to be filled with the next color material. A coating of color material is applied over the pixel then polished to remove excess color material. The remaining cavity to be processed will be exposed and developed to remove photo resist from the cavity. Another color layer is applied over the pixel and into the remaining cavity without color material. The color layer is then polished to remove undesired color material.

Figure 3A:
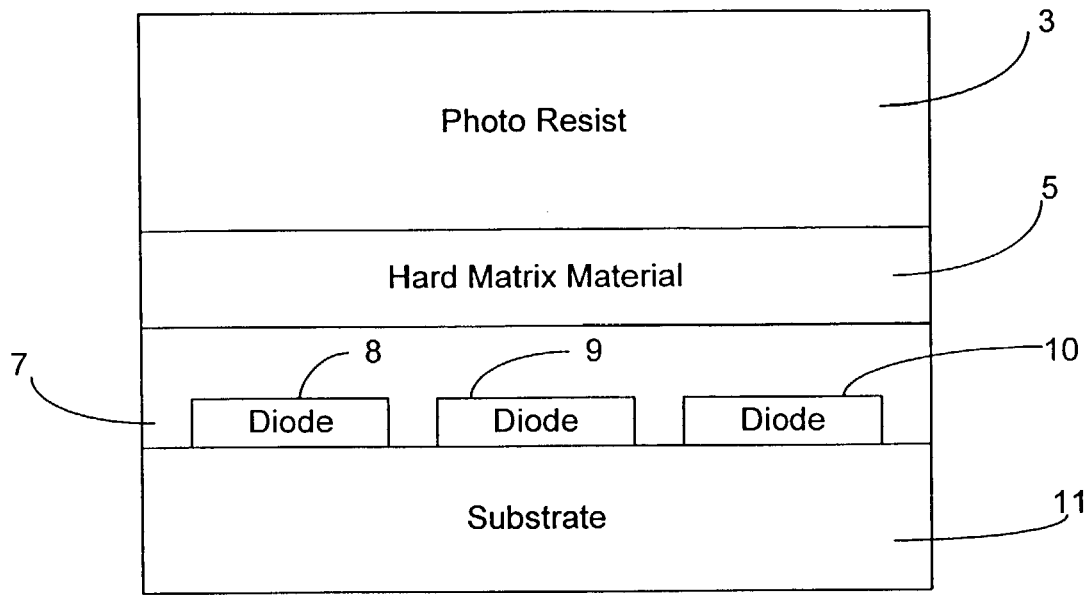
FIG. 3A shows a cross sectional view of an exemplary color pixel and filter structure before processing in accordance with one exemplary embodiment of the invention.
Figure 3B:
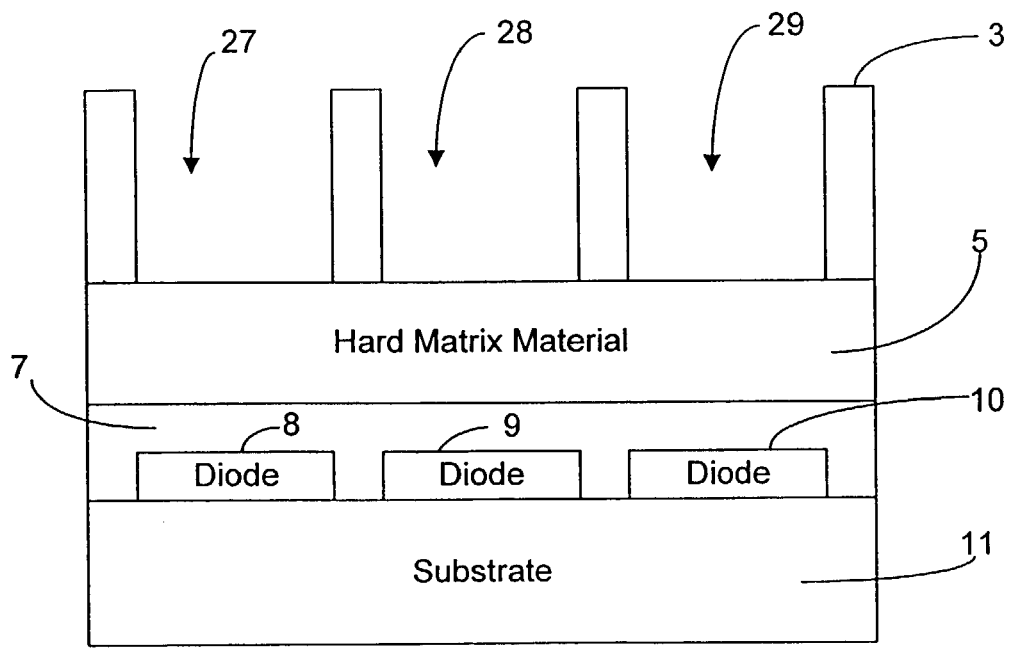
FIG. 3B shows a cross sectional view of the FIG. 3A color pixel and filter at a state of processing subsequent to that shown in FIG. 3A.
Figure 3C:
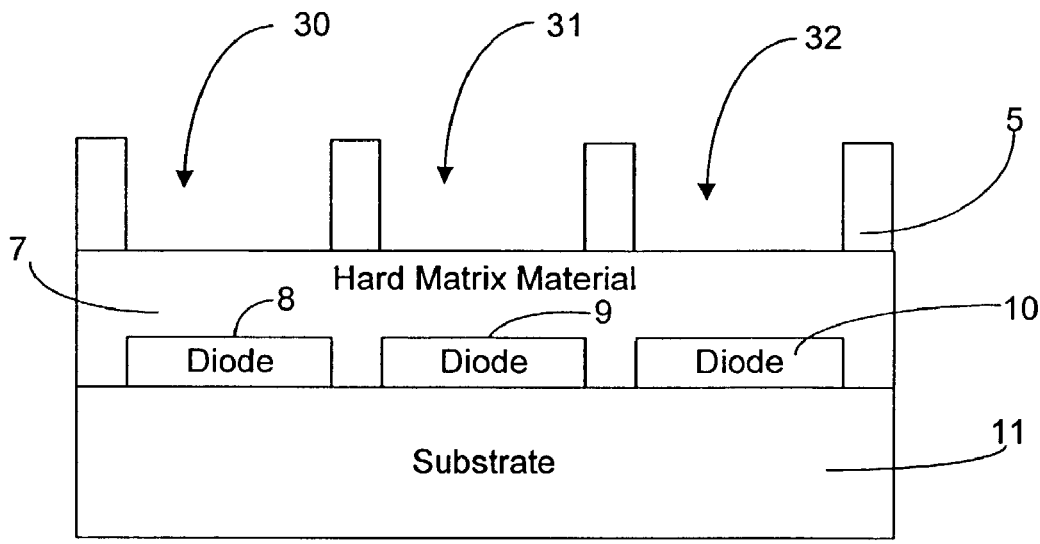
FIG. 3C shows a cross sectional view of the FIG. 3A color pixel and filter at a state of processing subsequent to that shown in FIG. 3B.
Figure 3D:
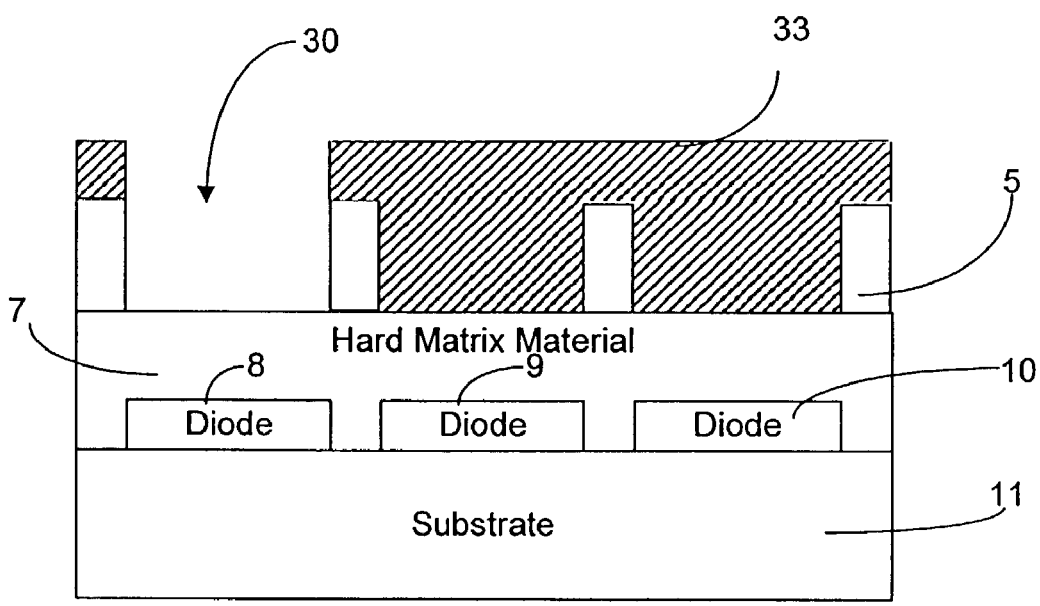
FIG. 3D shows a cross sectional view of the FIG. 3A color pixel and filter at a state of processing subsequent to that shown in FIG. 3C.
Figure 3E:
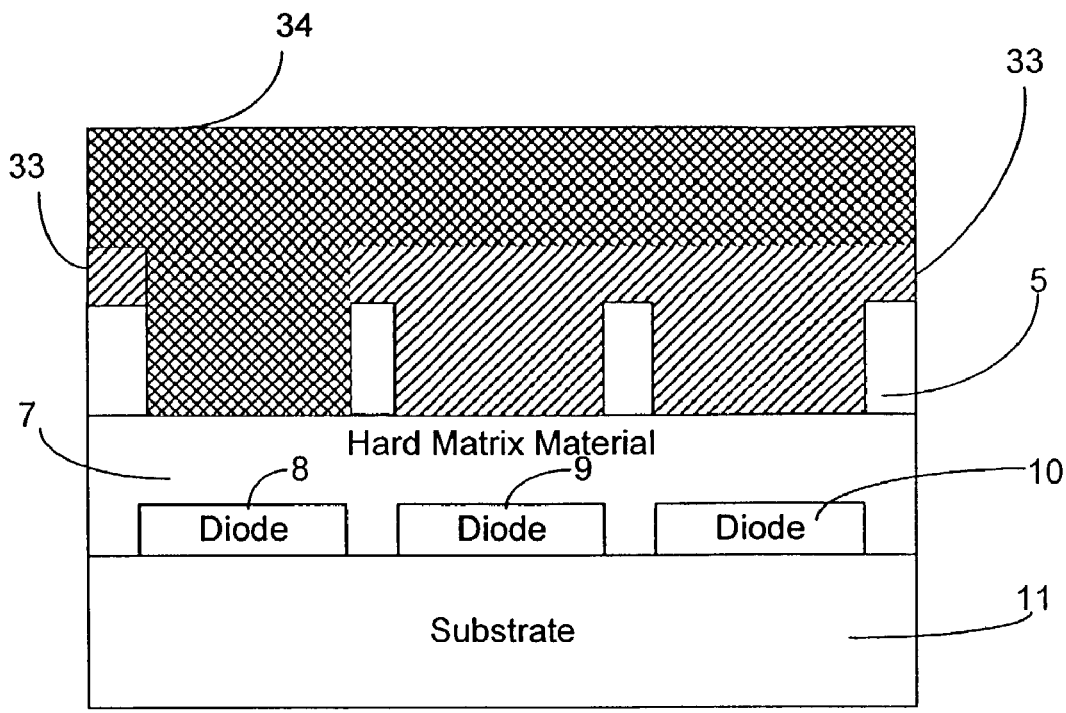
FIG. 3E shows a cross sectional view of the FIG. 3A color pixel and filter at a state of processing subsequent to that shown in FIG. 3D.
Figure 3F:
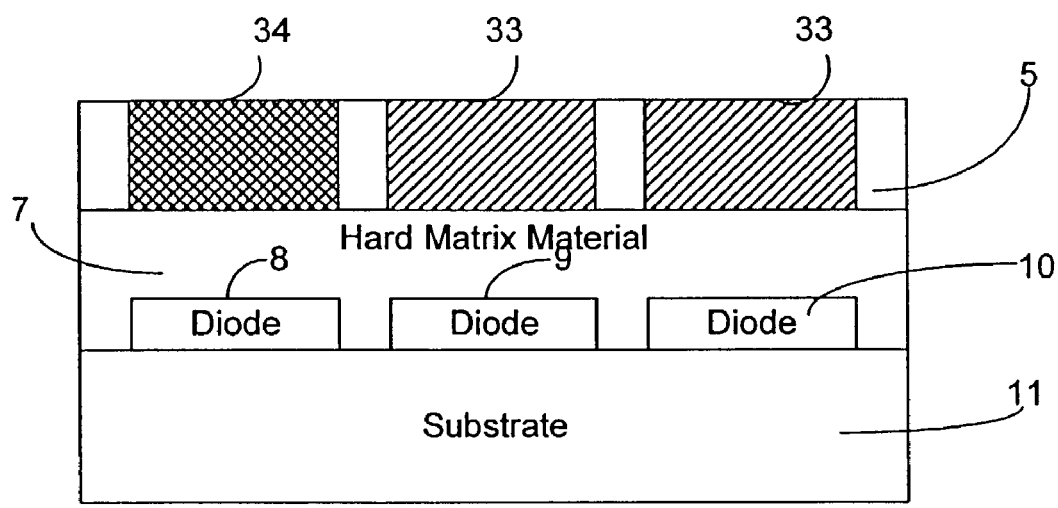
FIG. 3F shows a cross sectional view of the FIG. 3A color pixel and filter at a state of processing subsequent to that shown in FIG. 3E.
Figure 3G:
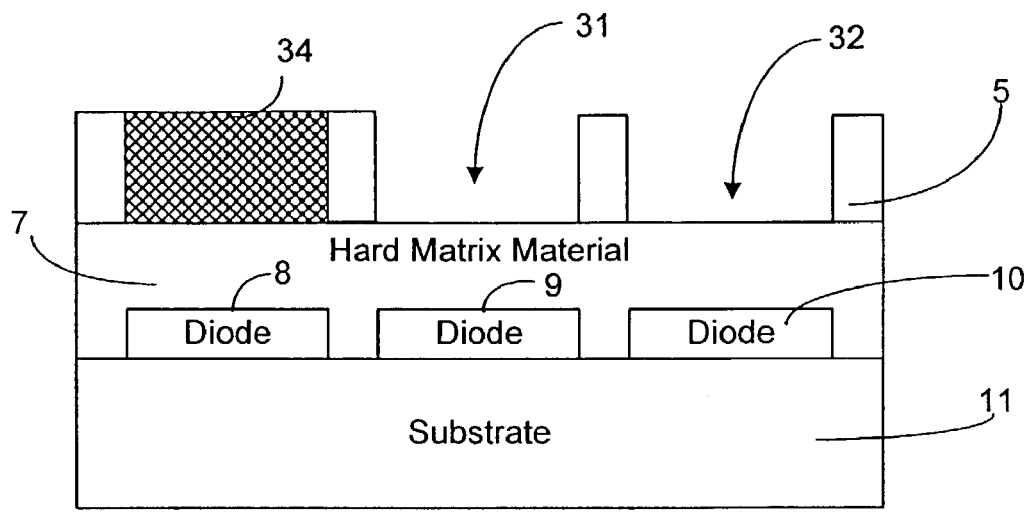
FIG. 3G shows a cross sectional view of the FIG. 3A color pixel and filter at a state of processing subsequent to that shown in FIG. 3F.
Figure 3H:
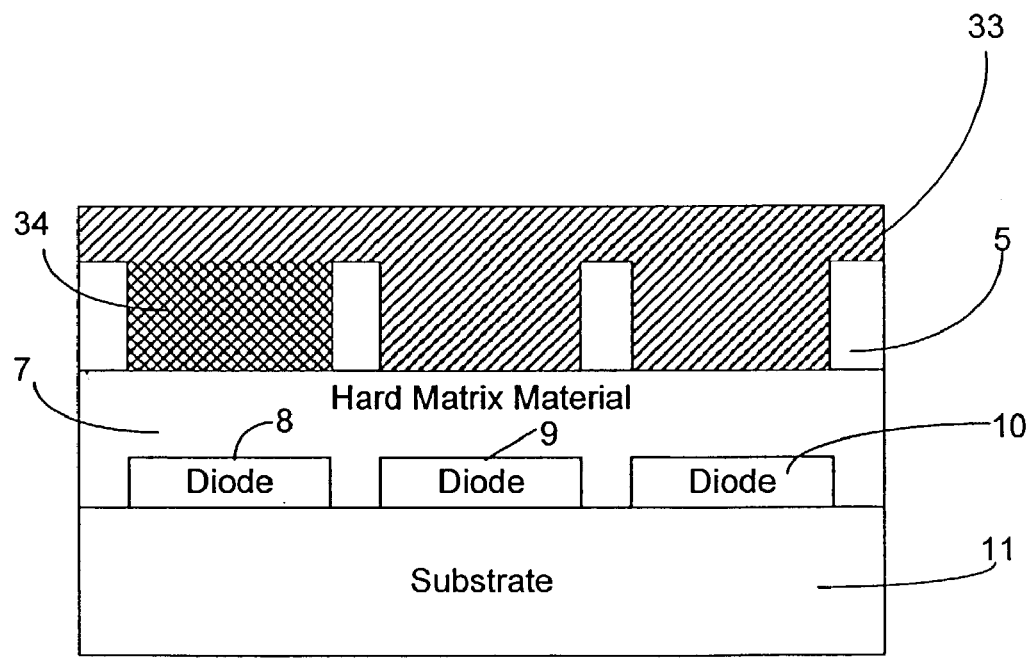
FIG. 3H shows a cross sectional view of the FIG. 3A color pixel and filter at a state of processing subsequent to that shown in FIG. 3G.
Figure 3I:
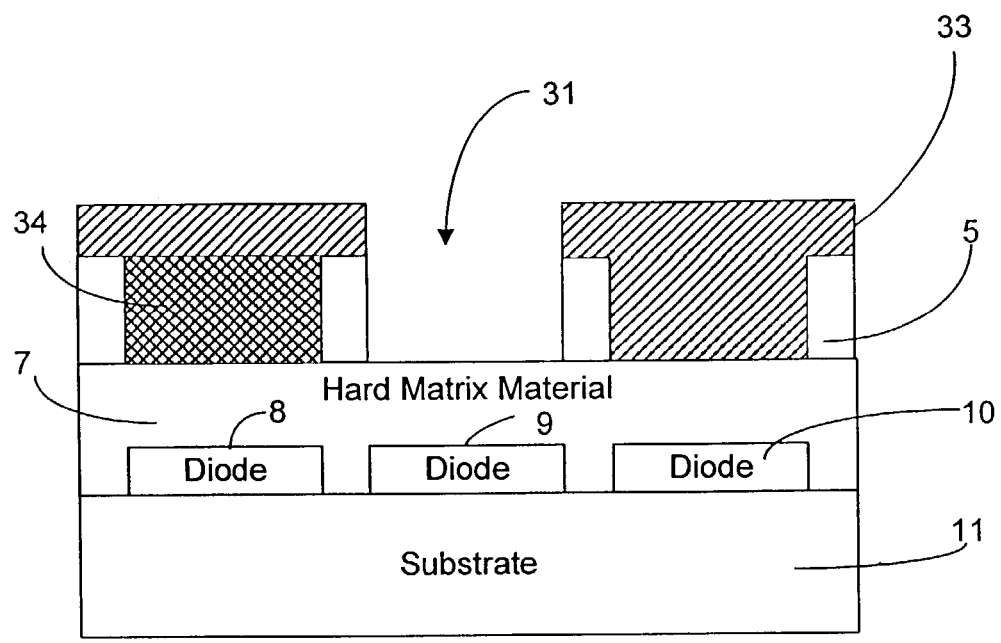
FIG. 3I shows a cross sectional view of the FIG. 3A color pixel and filter at a state of processing subsequent to that shown in FIG. 3H.
Figure 3J:
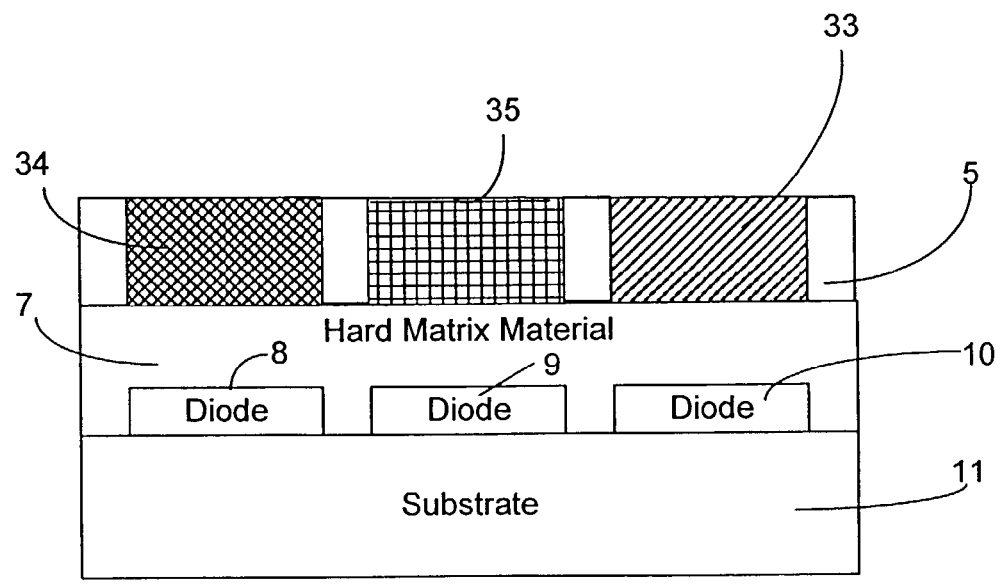
FIG. 3J shows a cross sectional view of the FIG. 3A color pixel and filter at a state of processing subsequent to that shown in FIG. 3I.
Figure 3K:
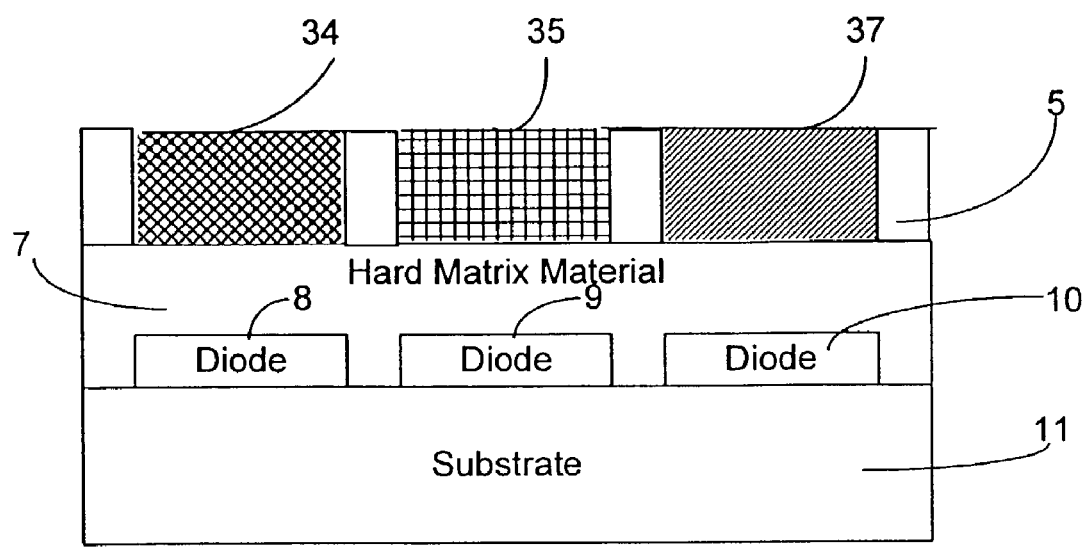
FIG. 3K shows a cross sectional view of the FIG. 3A color pixel and filter at a state of processing subsequent to that shown in FIG. 3I.

FIG. 3A shows the third embodiment with photodiodes 9 formed on a substrate 11. Oxide and metal layers 7 are formed on and around photodiodes 8, 9 and 10. A hard matrix material layer 5 is formed above the oxide and metal layers 6. A layer of photo resist 3 is formed above the matrix material layer 5. Referring to FIG. 3B, the photo resist layer 3 is imaged and cavities 27, 28 and 29 are made in the photo resist layer 3 above photodiodes 8, 9 and 10 using a standard resist process. As shown in FIG. 3C, the matrix material layer 5 is etched to form cavities 30, 31 and 32 above photodiodes 8, 9 and 10 and the photo resist 3 is stripped from the top of matrix layer 5. Referring to FIG. 3D, photo resist 33 is formed into cavities 30, 31 and 32 (FIG. 3C) and onto remaining portions of layer 5 then the photo resist 33 is imaged and etched to reopen cavity 30 above diode 8. Referring to FIG. 3E, a first color coat 34 (e.g., red) is formed into cavity 31 and on remaining photo resist layer 33. The color coat 34 and photo resist 33 is processed by CMP so that the color coat and photo resist 34 is removed so that the color coat 34 is flush with matrix layer 5 within cavity 30 (FIG. 3C) and photo resist 33 is flush with matrix layer 5 within cavities 31, 32 (FIG. 3C) as shown in FIG. 3F. Referring to FIG. 3G, photo resist 33 is removed from cavities 31, 32. Photo resist 33 is formed into cavities 31, 32 as well as on matrix layer 5 and first color layer 34 as shown in FIG. 3H. The photo resist 33 is then exposed and developed so the photo resist 33 within cavity 31 is opened as shown in FIG. 3I. A second color coating 35 is then applied on top of the remaining photo resist layer 33 and into cavity 31 and the second color coating 35 and photo resist 33 which rises above the level of matrix layer 5 is removed by CMP as shown in FIG. 3J. Referring to FIG. 3K, a third layer of color 37 is formed above the remaining matrix layer 5, color coatings 34, 35 and into cavity 32 (FIG. 3G) then color layer 37 is polished by CMP so that the third color layer 37 is flush with matrix layer 5.

Figure 12:
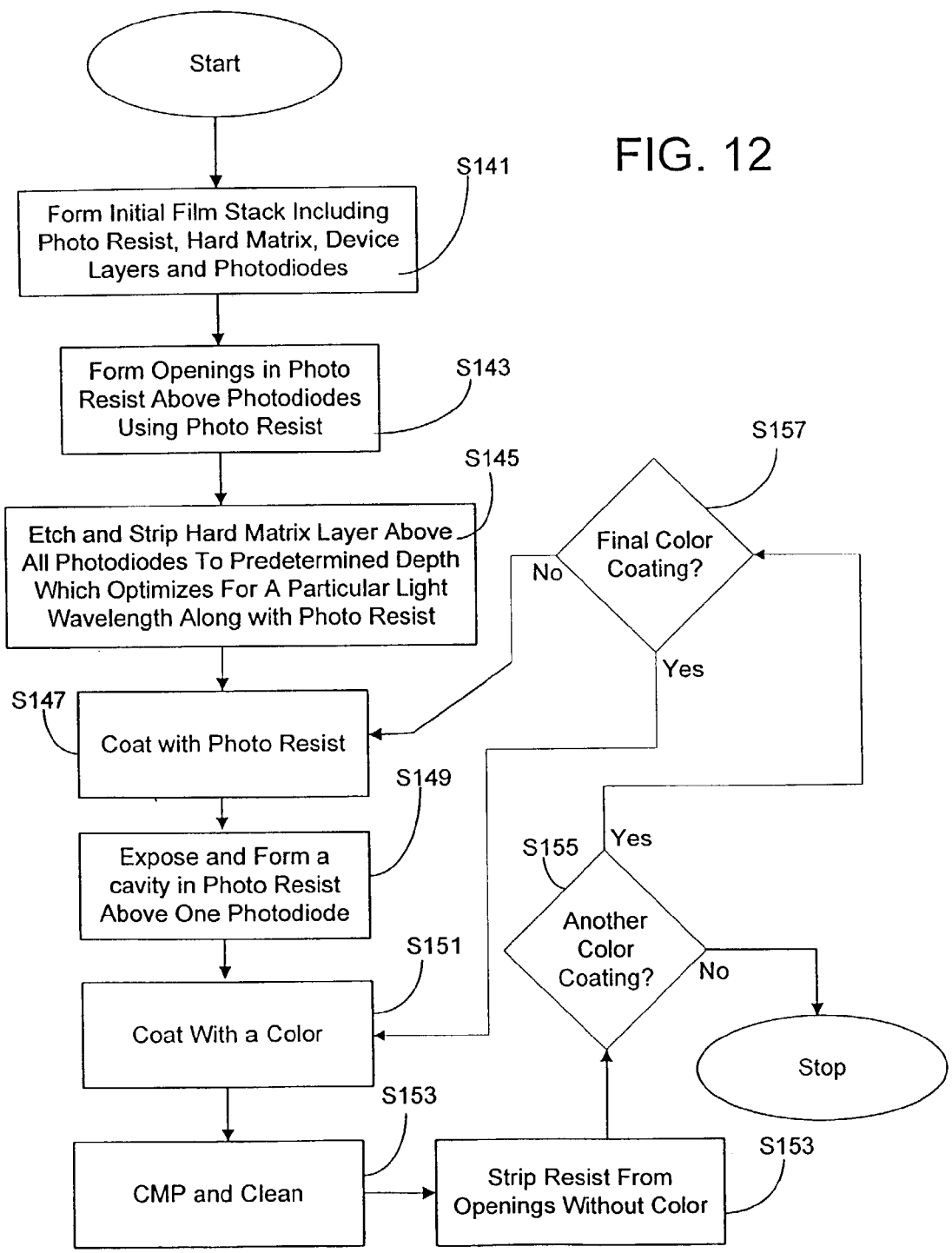
FIG. 12 shows a processing sequence for manufacturing a color pixel and filter element in accordance with an exemplary embodiment of the invention.

Referring to FIG. 12, an exemplary process is shown for manufacturing the FIG. 3K structure where all pixels are etched at once. At processing segment S141, an initial film stack (e.g., FIG. 3A) is formed including a substrate 11, photodiodes 8, 9, 10 on or at the top of the substrate 11, a device layer 7 around and above photodiodes 8, 9, 10, a hard matrix material layer 5 and then a photo resist layer 3 above the hard matrix layer 5. Cavities 27, 28, 29 are formed in photo resist layer 3 at processing segment S143. At processing segment S145, the matrix layer 5 is etched and stripped to form cavities 30, 31, 32 above all photodiodes 8, 9, 10. All photo resist 3 is stripped as well at processing segment S145. Standard photo resist 33 (FIG. 3D) is coated onto the remaining hard matrix layer 5 and into cavities 30, 31, 32 in matrix layer 5 at processing segment S147. At processing segment S149, the photo resist 33 is exposed and a cavity 30 is formed in the photo resist 33. At processing segment S151, a color coating 34 (e.g., red, blue, green) is applied onto photo resist 33 and into cavity 30. The applied color coating 34 is then removed above the level of the hard matrix layer 5 layer top so that the applied color remaining is previous cavity 30 is flush with the hard matrix layer 5 at processing segment S153. At processing segment S153, the photo resist 33 in cavities without color coating, i.e., 31, 32 is stripped. At processing segment S155, a determination of whether or not another color coating is to be applied is made. If another color coating is to be applied, then another determination is made as to whether or not the new color coating is a final color coating at processing segment S157. If the coat to be applied is not a final coat, then processing continues at processing segment S147 and continues until processing segment S155 where another determination of whether or not another color coating is to be applied. If another color coating is to be applied, then another determination is made at processing segment S157 of whether or not the color coating to be applied is a final color coating. If the color coating to be applied is a final color coating, then processing recommences at processing segment S151 where a final color coating is applied then processing continues to processing segment S155 then terminates as there are no further color coatings to be applied.

Figure 4A:
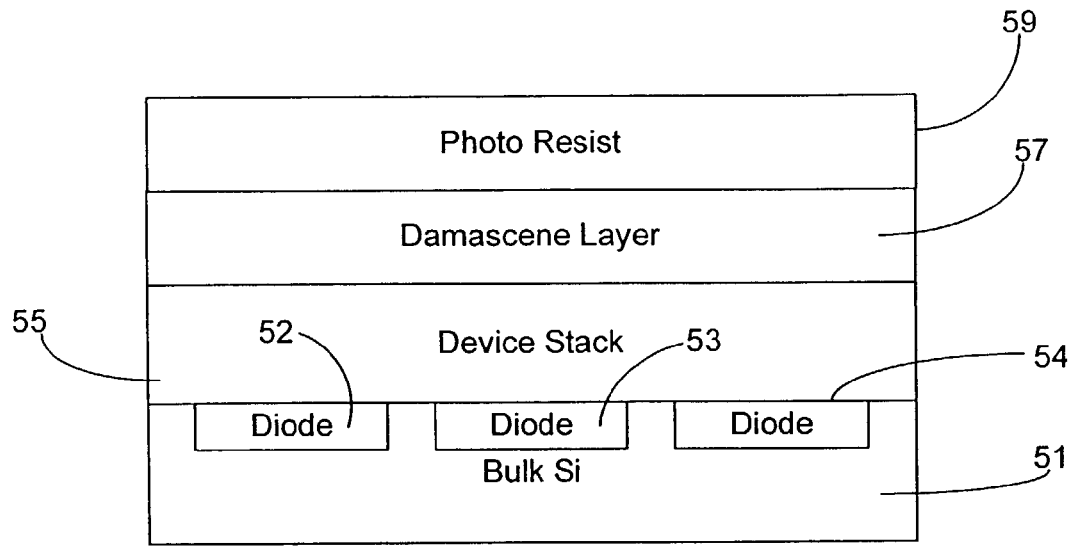
FIG. 4A shows a cross sectional view of an exemplary color pixel and filter structure before processing in accordance with one exemplary embodiment of the invention.

A fourth embodiment of the invention allows for the adjustment of the depths and composition of the color filter to optimize various optical characteristics of the pixel array elements. Referring to FIG. 4A, an imager chip is formed with bulk silicon 51, photodiodes 52, 53, 54 formed on the bulk substrate 51, a device stack and electrical components 55 are formed on top of the photodiodes 52, 53, 54. The device stack 55 is planarized to smooth it, then a damascene layer 57 is formed above the device stack 55 to a desired initial depth. As shown in FIG. 4A, a standard simplified CMOS imager circuit is formed with photodiodes 52, 53, 54, interconnects and transistors without the need for various depths to the photodiodes in combination with a variety of other circuit or substrate elements which are varied as well.

Figure 4B:
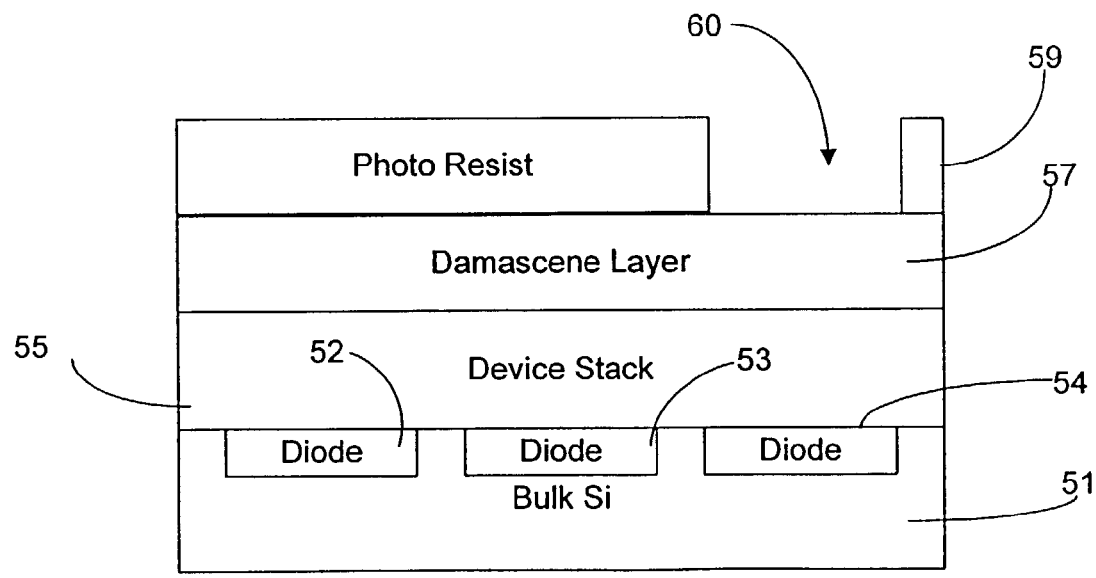
FIG. 4B shows a cross sectional view of the FIG. 4A color pixel and filter at a state of processing subsequent to that shown in FIG. 4A.
Figure 4C:
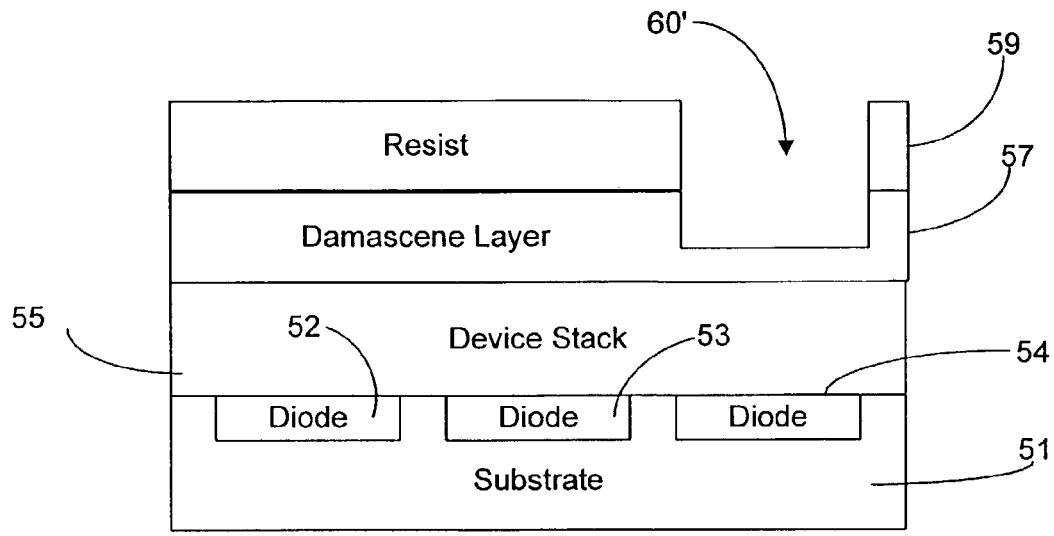
FIG. 4C shows a cross sectional view of the FIG. 4A color pixel and filter at a state of processing subsequent to that shown in FIG. 4B.
Figure 4D:
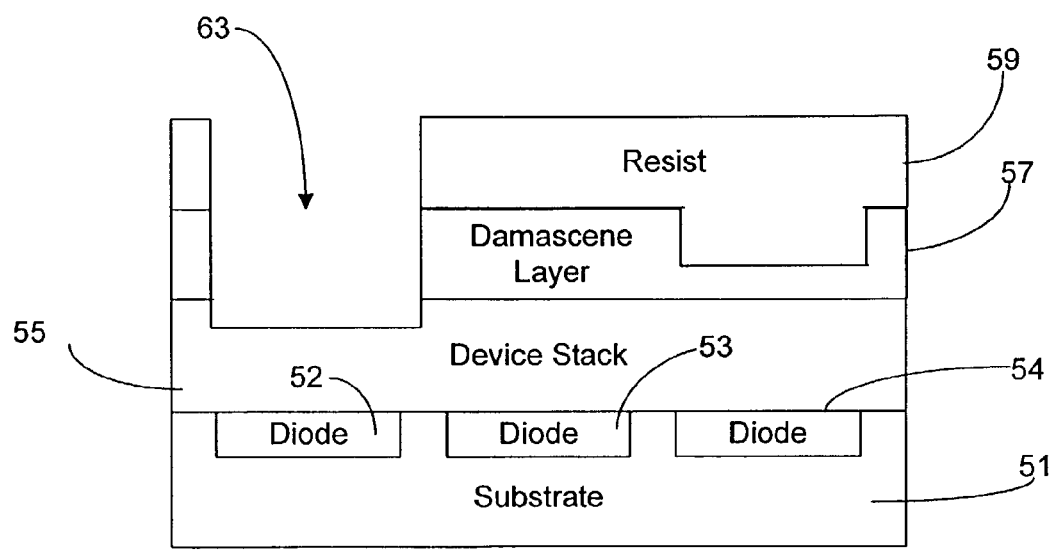
FIG. 4D shows a cross sectional view of the FIG. 4A color pixel and filter at a state of processing subsequent to that shown in FIG. 4C.
Figure 4E:
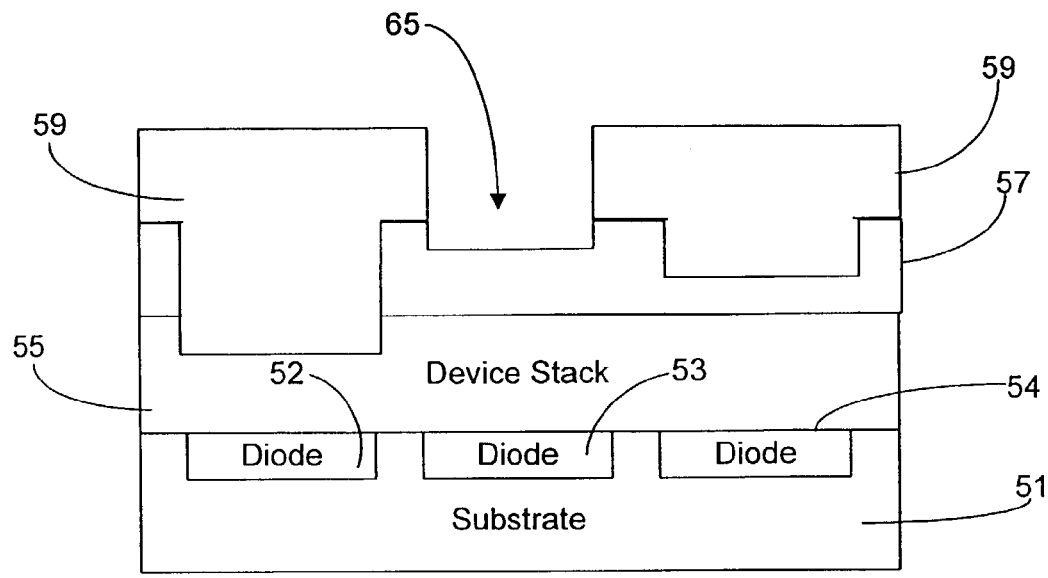
FIG. 4E shows a cross sectional view of the FIG. 4A color pixel and filter at a state of processing subsequent to that shown in FIG. 4D.
Figure 4F:
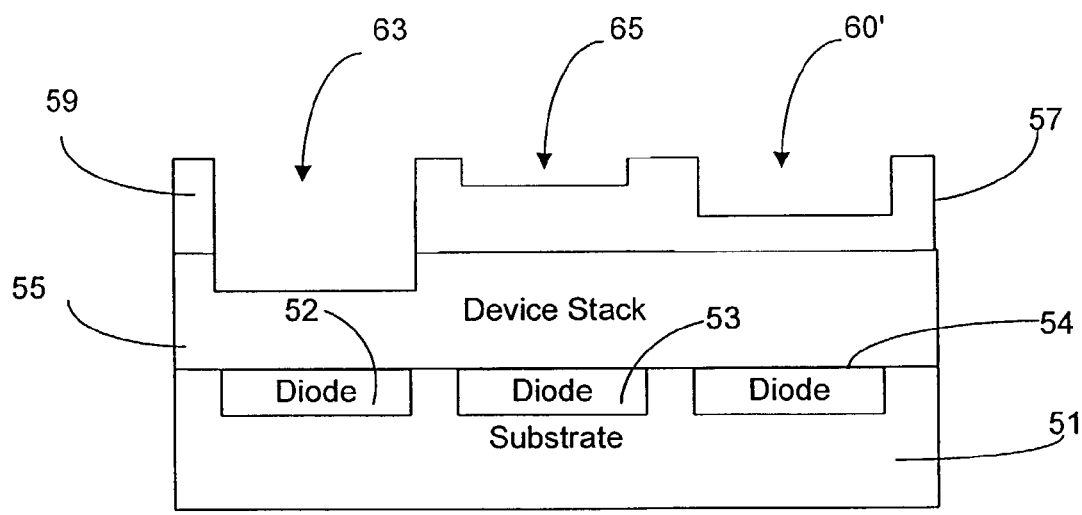
FIG. 4F shows a cross sectional view of the FIG. 4A color pixel and filter at a state of processing subsequent to that shown in FIG. 4E.
Figure 4G:
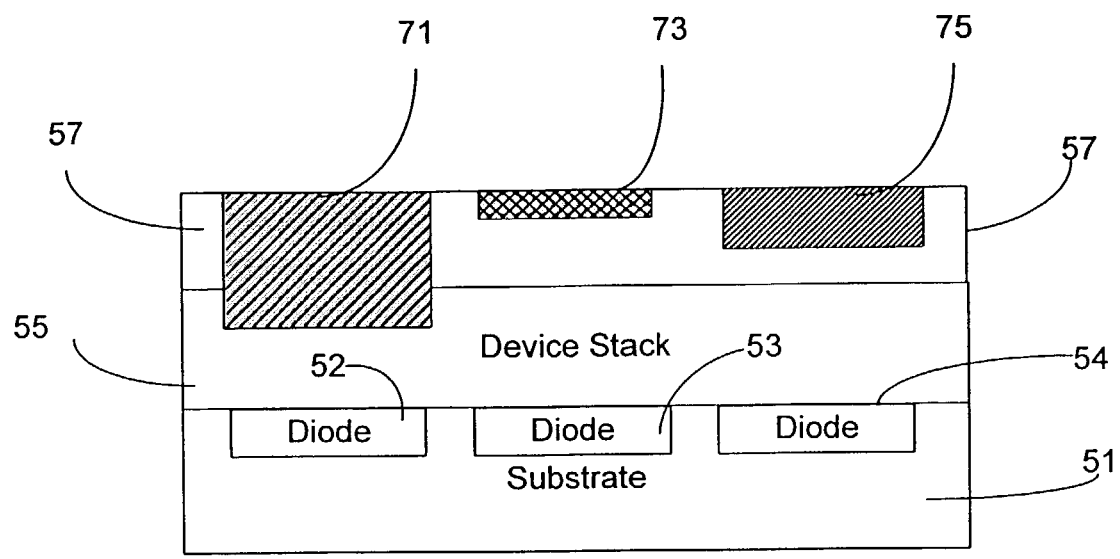
FIG. 4G shows a cross, sectional view of the FIG. 4F color pixel and filter at a state of processing subsequent to that shown in FIG. 4F.

Referring to FIG. 4B, the photo resist layer 59 is imaged and a cavity 60 is formed in the resist 59 above a photodiode, e.g., 54. The depths of the cavities formed into the damascene layer 57 in this and subsequent processing, and the device layer 25 if required, is determined by well known formulas and principles used to optimize optical properties of the layers with respect to a color wavelength which a diode in question is designed to sense including intensity or reflectivity of incident light. Determination of optical properties of layers is well known in the art and is in part described above. Referring to FIG. 4C, the photo resist 59 is etched to form a cavity 60' in the damascene layer 57 for the color filter being constructed. Referring to FIG. 4D, photo resist 59 is formed into cavity 60'. Then, another cavity is formed into the photo resist 59 above another photodiode, e.g., 52, then the hard matrix layer 5 and the device layer 7 is etched to form another cavity 63. The depth of the cavity 63 above photodiode 52 is determined to optimize incident light on photodiode 52. Referring to FIG. 4E, another layer of photo resist 59 is formed into the cavity 63 above photodiode 53 then another cavity 65 is formed above the remaining photodiode 53 with a depth which is determined to optimize incident light on photodiode 53. Referring to FIG. 4F, photo resist 59 is stripped from the top of hard matrix layer 57 as well as cavities 60', 63 and 65. Referring to FIG. 4G, then each cavity, i.e., 60', 63 and 65 is filled with a different color material 71, 73, 75 (e.g., red, blue or green) which corresponds to a cavity which has been optimized for a particular color material.

Depth of etching into the damascene layer 57, as well as a portion of the device stack, is based in part on absorptive and refractive modeling results. Each cavity has a different dimension due to the need to vary a CFA window dimension given a desired wavelength of light that a particular photodiode is expected to process. FIG. 4G shows an exemplary embodiment of completed CFA window cavities into the damascene layer 57 as well as device stack above each photodiode location. In the FIG. 4G exemplary embodiment, each CFA window is then filled with a color pigment or filtering material. FIG. 4G shows an exemplary embodiment of completed imager with CFA windows etched and filled with the appropriate color or filtering substance. In this embodiment, red is on the left, blue is in the middle and green filtering material is used on the right hand side. However, a variety of color schemes and orders of color manufacturing for a given CFA window can be used with the invention.

Figure 13:
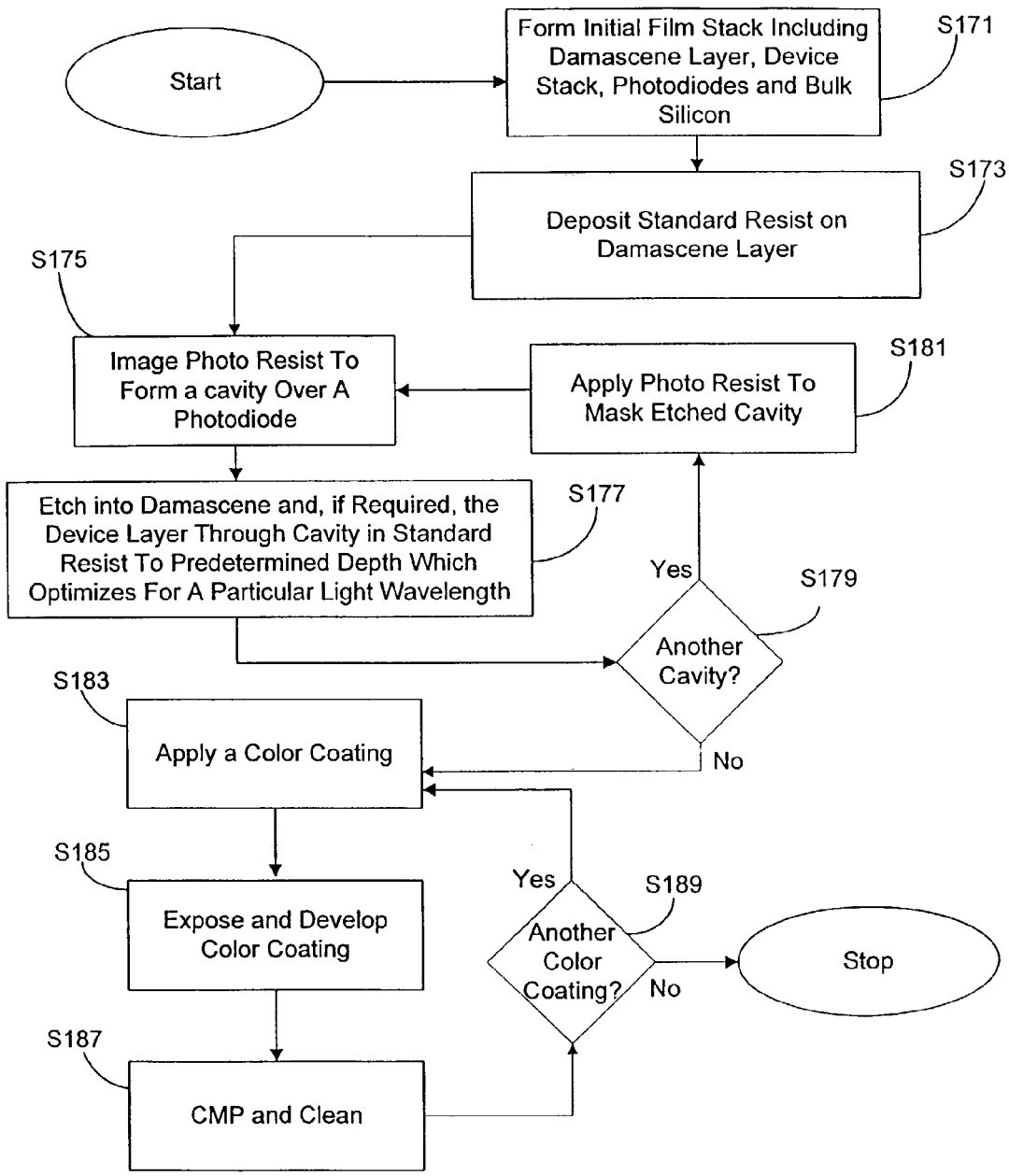
FIG. 13 shows a processing sequence for manufacturing a color pixel and filter element in accordance with an exemplary embodiment of the invention.

Referring to FIG. 13, an exemplary process is shown for manufacturing a structure with different CFA window dimensions such as the structure shown in FIG. 4G. At processing segment S171, an initial film stack is formed including a damascene layer 57, a device stack above photodiodes 55, photodiodes 52, 53, 54 and bulk silicon 51. At processing segment S173, a layer of standard photo resist 59 is deposited on the damascene layer 57. At processing segment S175, a cavity is imaged in the standard photo resist above a photodiode (e.g., 54). At processing segment S177, etching is accomplished into the damascene 57 and, if necessary, the device layer 55 through the cavity 60 in the photo resist to a predetermined depth which optimizes optical characteristics for a particular light wavelength expected to be absorbed by a photodiode (e.g., 54) underneath the cavity. At processing segment S179, a determination of whether or not another cavity in the damascene layer 57 and/or device layer 55 is required. If another cavity is required, then photo resist is applied into the previously etched cavity 60' through the photo resist 59 and damascene layer 55 to mask the etched cavity 60'. Processing segments S175 through S179 are then repeated to form cavities 63, 65 which have dimensions that will optimize the optical properties of the layers above the respective photodiodes 52, 53 underneath cavities 63, 65. When it is determined at processing segment S179 that no further cavities are needed in the damascene 57 and/or device stack 55, then processing commences at processing segment S183 where a coating is applied into a cavity which has been formed to receive a particular color wavelength. At processing segment S185, the color coating is exposed and developed. At processing segment S187, the color coating applied at processing segment S187 is polished by CMP and cleaned. At processing segment S189, a determination is made of whether or not another color coating is required. If another color coating is required to be formed into a cavity without color material, then processing continues at processing segment S183 through S189 until no further color coatings are required and processing ceases.

Figure 5A:
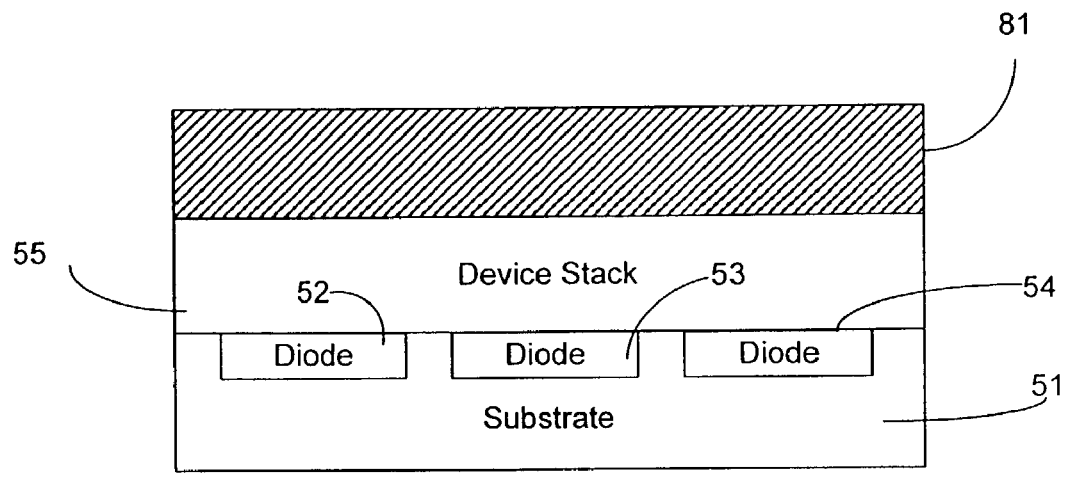
FIG. 5A shows a cross sectional view of a portion of a color pixel structure before processing in accordance with one exemplary embodiment of the invention.
Figure 5B:
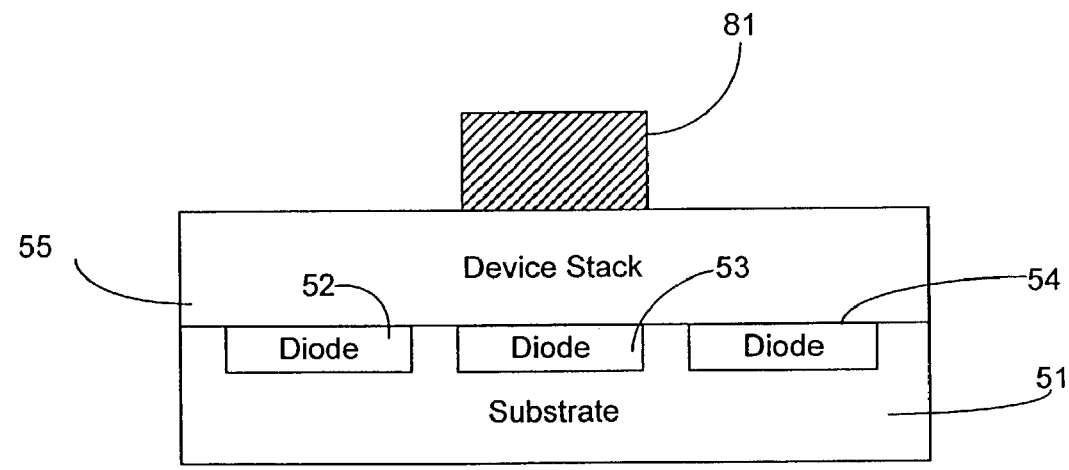
FIG. 5B shows a cross sectional view of the FIG. 5A color pixel and filter structure at a state of processing subsequent to that shown in FIG. 5A.
Figure 5C:
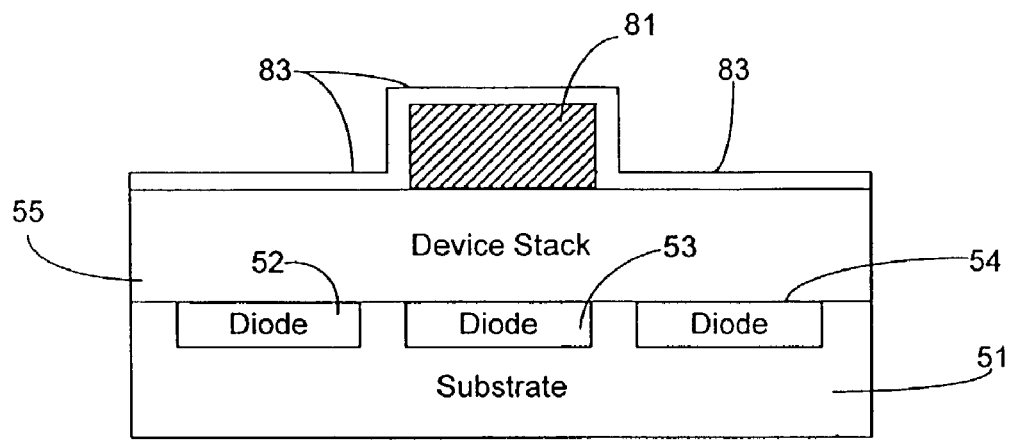
FIG. 5C shows a cross sectional view of the FIG. 5A color pixel and filter structure at a state of processing subsequent to that shown in FIG. 5B.

Many alternative embodiments are possible which employ CFA filters which are optimized for optical properties using a damascene layer or variable CFA window dimensions or both. For example, FIG. 5A shows the addition of a general filtering layer 81 above the device stack 55 and over a photodiode 53, in this embodiment, tuned for a green wavelength of light incident to a photo detector through the layers above photodiode 54. In FIG. 5B, the general filtering layer 81 is planarized in order to leave a portion of the general filtering layer 81 (extended damascene filter layer) extending above the device stack layer 55 over one photodiode 53. The device stack 55 or the general filtering layer 81 depth has a thickness or composition which is optimized or tuned for the initial color which is being formed onto the device stack. Next, in FIG. 5C the extended damascene filter layer 81 remaining after planarization is encapsulated with encapsulation material 83. Encapsulation can be accomplished with a variety of materials including low temp oxide material, such as dark silicon rich nitride, low temp DARC, TEOS or spin on glass (SOG).

Figure 5D:
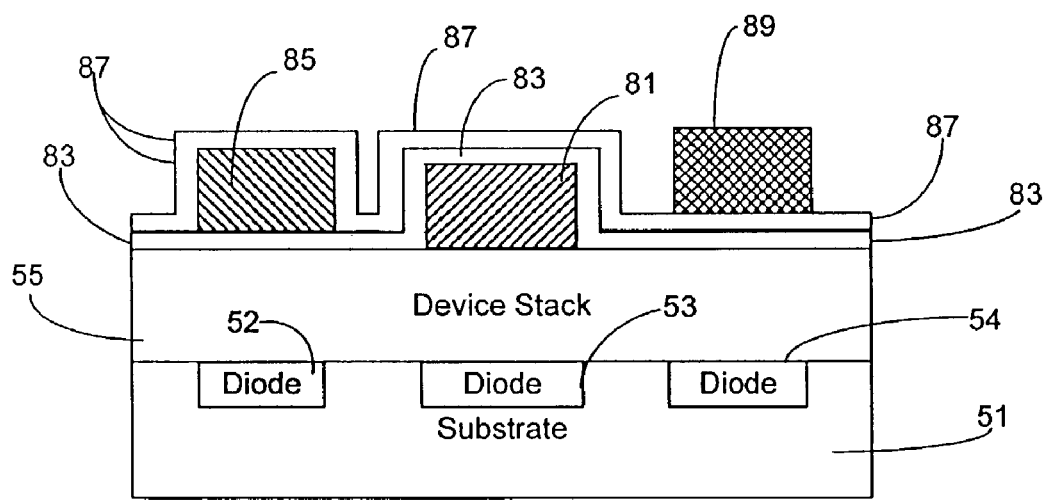
FIG. 5D shows a cross sectional view of the FIG. 5A color pixel and filter structure at a state of processing subsequent to that shown in FIG. 5C.

Referring to FIG. 5D, another general filtering layer is formed on the first layer of encapsulation material 83 then planarized to leave a portion of filtering material 85 (extended damascene filter layer) extending above the device stack 55 over a different photodiode 52. The extended damascene filter layer 85 in this exemplary embodiment is tuned or optimized for a red filtering material. Additional encapsulation material 87 is formed above the extended damascene filter layer 85 and over the first encapsulation layer 83. Then, another general filtering layer (e.g., blue) is formed over the surface of the second encapsulation layer 87, which is above another photodiode location 54 without general filtering material, and then etched to form another extended damascene filter layer 89.

In the exemplary embodiment in FIG. 5D, the extended damascene filter layers 83, 85, 89 as well as the encapsulation layers 83, 87 are designed to optimize optical characteristics of one or more layers through which light is incident on the photodiodes 52, 53, 54. Encapsulation layers under, for example, the blue extended damascene filter layer are thicker than the encapsulation layers of the other extended damascene filter layers. Instead of etching down, this embodiment involves building substrate up from a node or area to a point where the intensity or other optical property shows a maximum or other desirable value. The encapsulation material can be cleared if it is required, such as if such removal improves color transmission at the diode light incident surfaces.

Figure 5E:
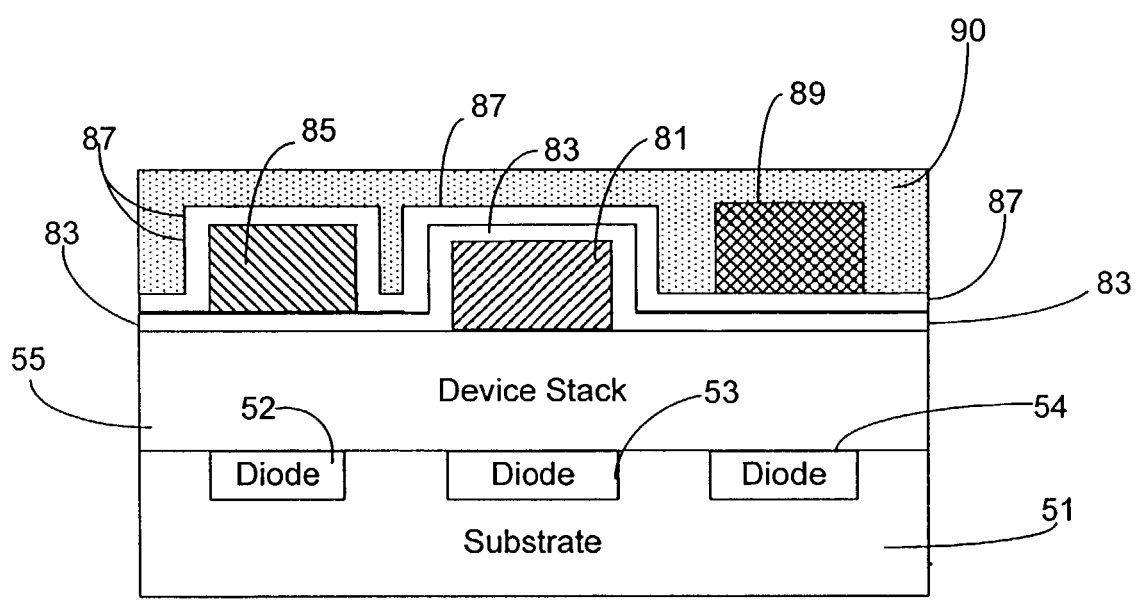
FIG. 5E shows a cross sectional view of the FIG. 5A color pixel and filter structure at a state of processing subsequent to that shown in FIG. 5D.

Referring to FIG. 5E, a final coat or layer 90 is placed on top of the encapsulation material. In some embodiments, a micro lens is placed on top of the encapsulation material, which can be an optically clear material. FIG. 5E shows an embodiment with an encapsulation scheme which employs a uniform encapsulation material 90 which is placed above and around all extended damascene filter layers 81, 85, 89 and thin encapsulation layers 83, 87.

Figure 14:
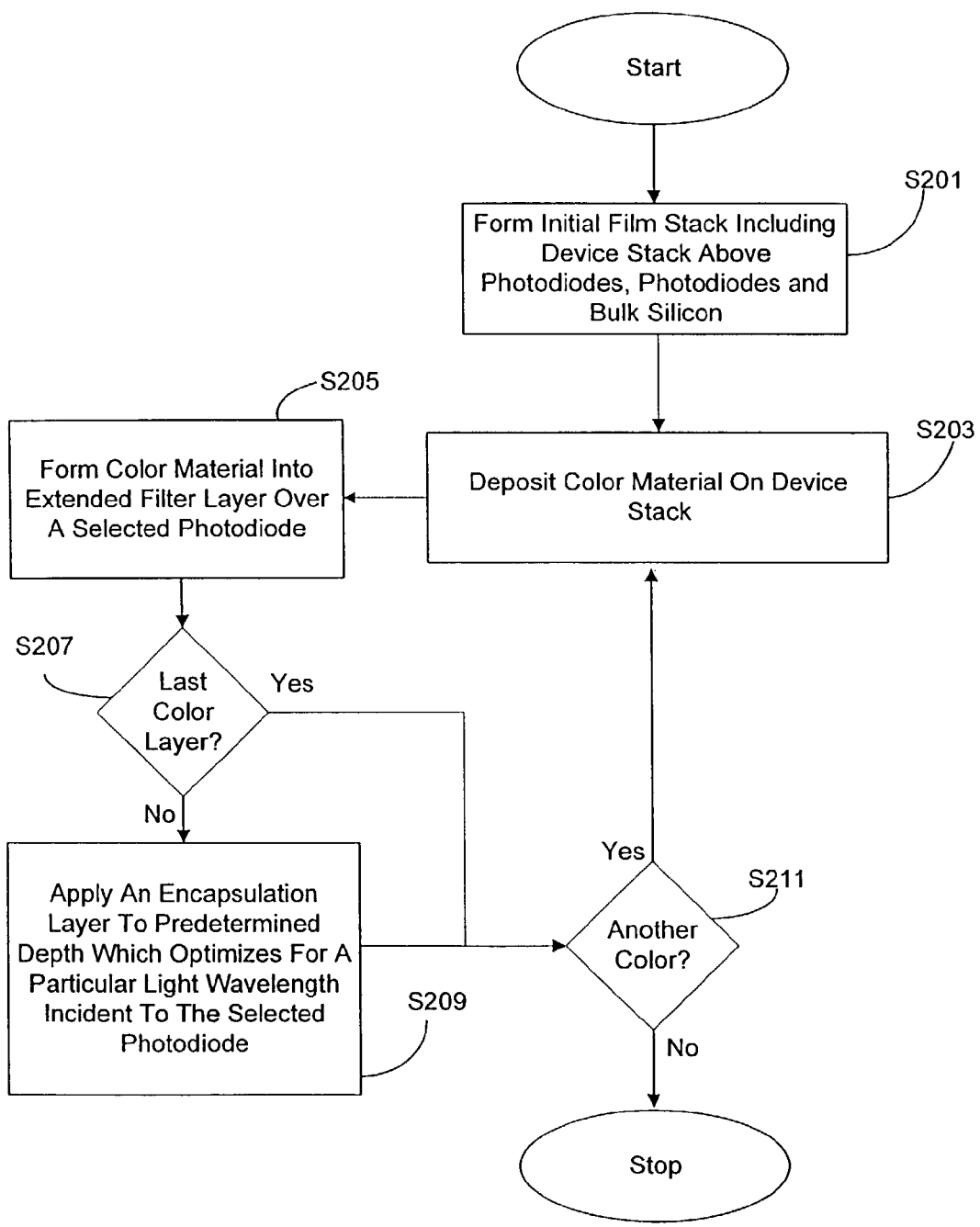
FIG. 14 shows a processing sequence for manufacturing a color pixel and filter element in accordance with an exemplary embodiment of the invention.

Referring to FIG. 14, an exemplary process is shown for manufacturing a structure with variable damascene filter structures resulting in optimized optical properties for layers above a particular photodiode such as, for example, the exemplary structure shown in FIG. 5D. At processing segment S201, an initial film stack is formed including a device stack 55 above photodiodes 52, 53, 54 which are emplaced on or above bulk silicon 51. At processing segment S203, a layer of color filter material 81 is deposited on the device stack 55. At processing segment S205, the color filter material layer 81 is formed into an extended damascene filter layer 81. At processing segment S207, a determination is made of whether or not the color material applied and formed in processing segments S203-S205 is the final color coating. If additional color coatings are to be applied, the processing continues at processing sequence S209 where an encapsulation layer 83 is formed with a predetermined depth which optimizes optical properties of layers above a selected photodiode (e.g., 52) for a particular wavelength of light incident to the selected photodiode (e.g., 52). At processing segment 211, a determination of whether or not another color is to be applied. If another color layer (e.g., 85) requires application, then processing continues at processing segment S203 and continues through S209. If a color layer applied in processing segments 203 and formed in S205 is the final color layer, then processing branches to processing segment S209 which then terminates processing.

Figure 6A:
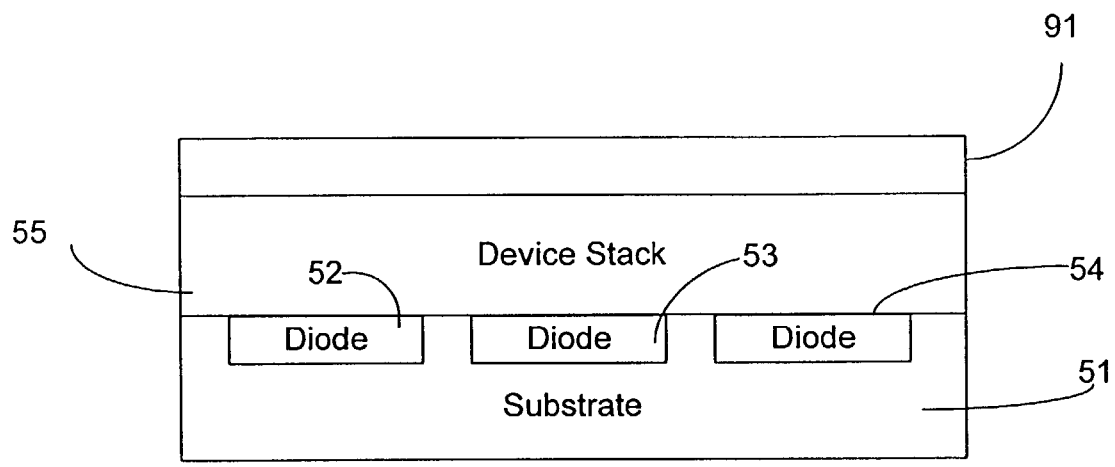
FIG. 6A shows a cross sectional view of a portion of a color pixel structure before processing in accordance with one exemplary embodiment of the invention.
Figure 6B:
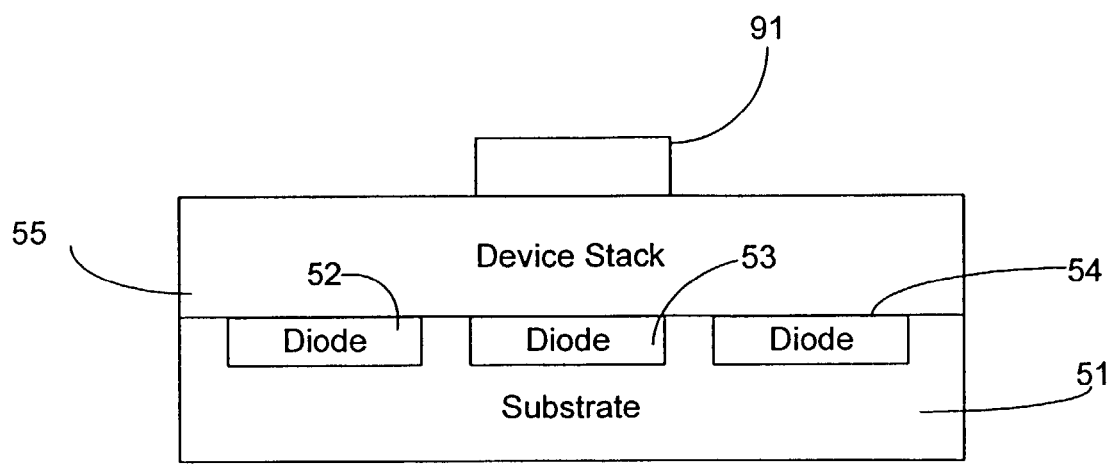
FIG. 6B shows a cross sectional view of the FIG. 6A color pixel and filter structure at a state of processing subsequent to that shown in FIG. 6A.
Figure 6C:
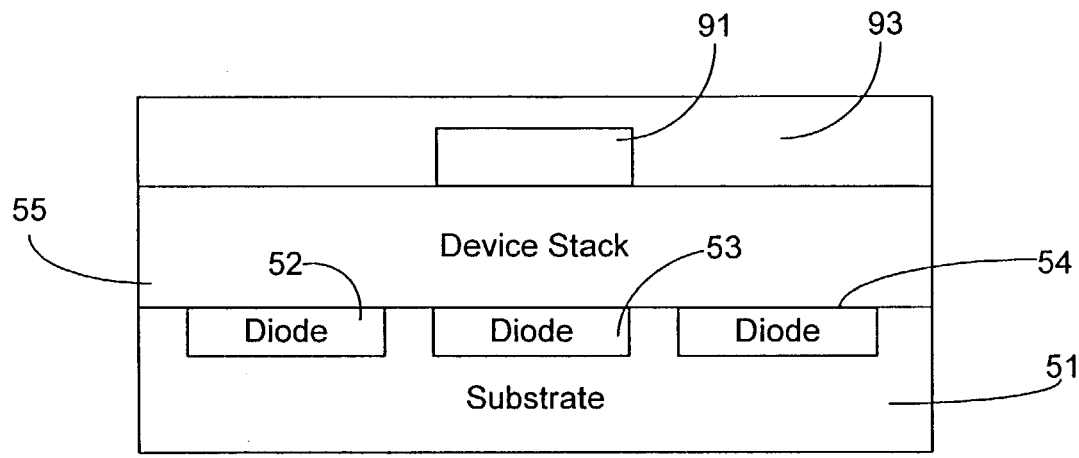
FIG. 6C shows a cross sectional view of the FIG. 6A color pixel and filter structure at a state of processing subsequent to that shown in FIG. 6B.
Figure 6D:
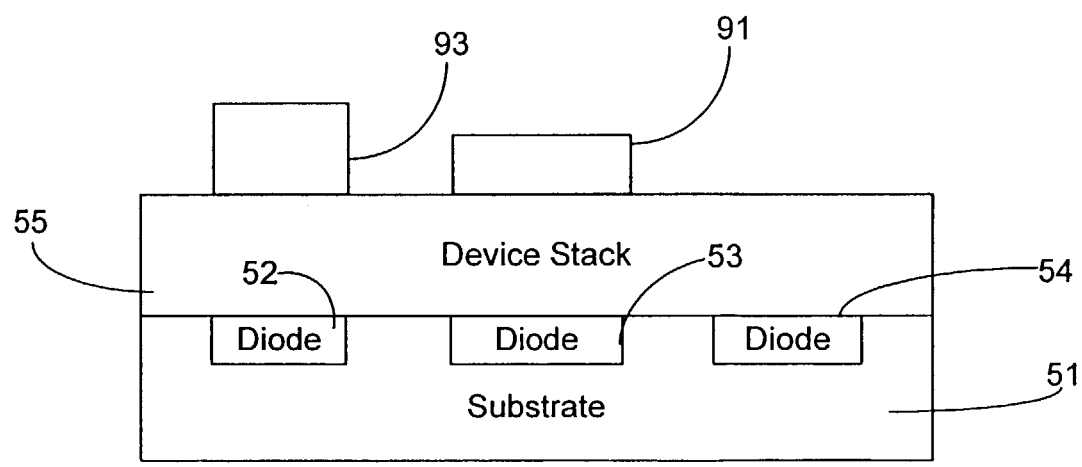
FIG. 6D shows a cross sectional view of the FIG. 6A color pixel and filter structure at a state of processing subsequent to that shown in FIG. 6C.
Figure 6E:
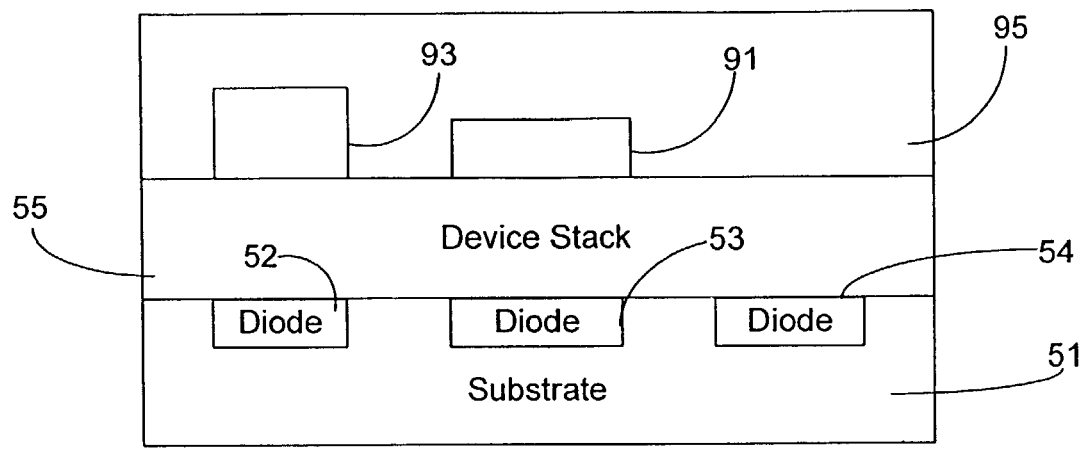
FIG. 6E shows a cross sectional view of the FIG. 6A color pixel and filter structure at a state of processing subsequent to that shown in FIG. 6D.
Figure 6F:
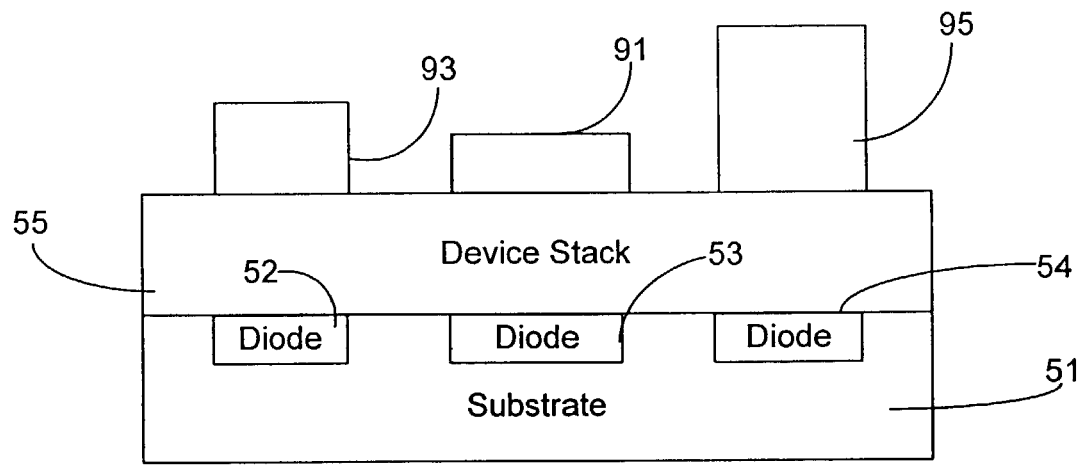
FIG. 6F shows a cross sectional view of the FIG. 6A color pixel and filter structure at a state of processing subsequent to that shown in FIG. 6E.
Figure 6G:
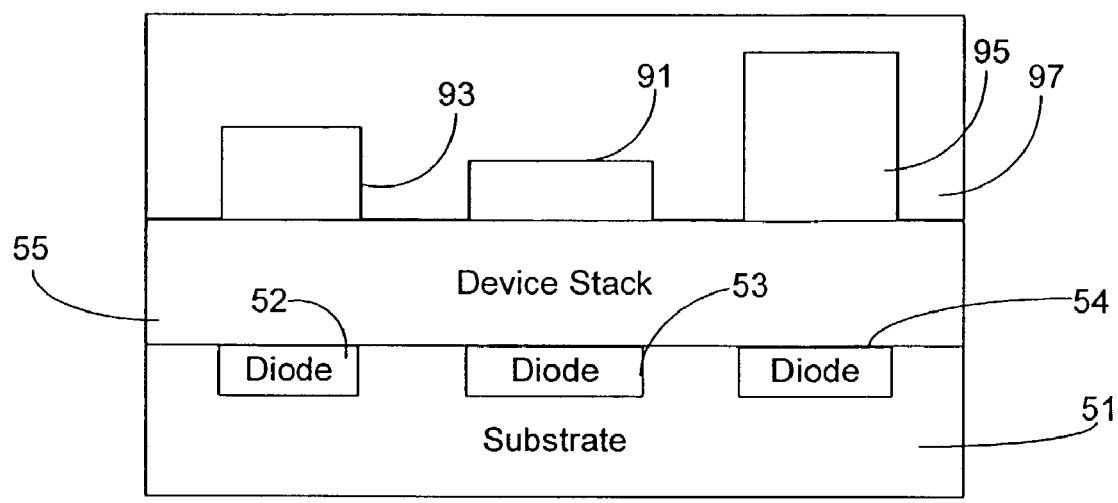
FIG. 6G shows a cross sectional view of the FIG. 6A color pixel and filter structure at a state of processing subsequent to that shown in FIG. 6F.

Referring to FIGS. 6A-6G, another exemplary embodiment includes the extended damascene layers or extrusions without the encapsulation layers 83, 87. FIG. 6A shows the addition of a general filtering layer 91 above the device stack 55. In FIG. 6B, the general filtering layer in this embodiment is tuned for green wavelength of light. In FIG. 6B, the general filtering layer 91 is planarized in order to leave a portion of the general filtering layer 91 (extended damascene layer) extending above the device stack layer 55 over one photodiode 53. Next, in FIG. 6C another general filtering layer 93 tuned to a different light wavelength, e.g., red, is formed on the device layer over another photodiode 52. Referring to FIG. 6D, the second general filtering layer 93 is planarized to leave a portion of filtering material 93 (extended damascene layer) extending above the device stack 55 over a different photodiode 52. Referring to FIG. 6E, another general filtering layer 95 (e.g., blue) is formed over the surface the device stack 55 and the extended damascene layers 91, 93 previously formed. In FIG. 6F, the general filtering material which is tuned, in this example for blue wavelength of light is planarized to form another extended damascene layer 95 which is above another photodiode location 54. Referring to FIG. 6G, an encapsulation material 97 is formed over the extended damascene layers as well to serve a variety of functions including further alterations of the optical properties of the combined layers through which light must pass above a particular photodiode.

Figure 15:
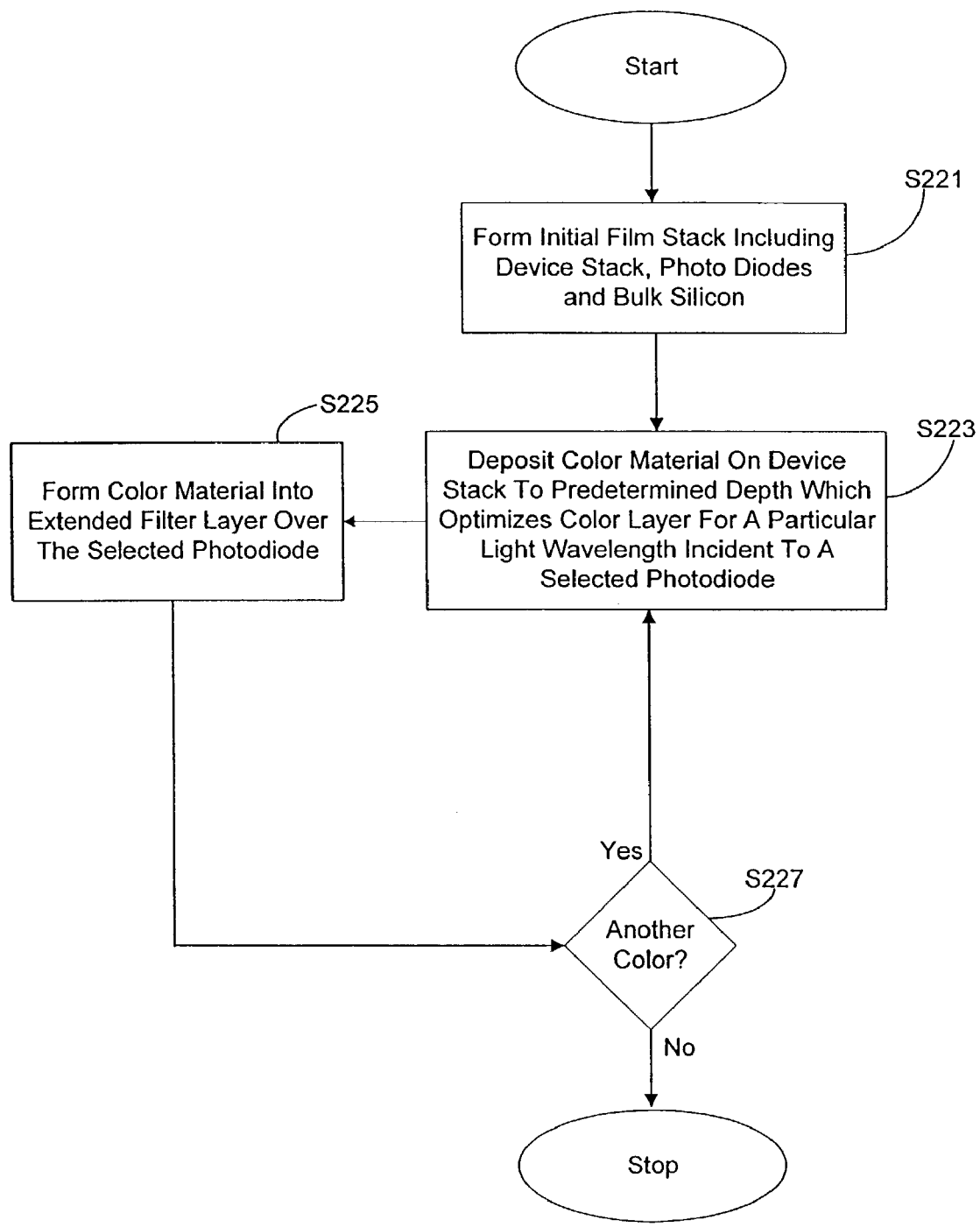
FIG. 15 shows a processing sequence for manufacturing a color pixel and filter element in accordance with an exemplary embodiment of the invention.

Referring to FIG. 15, another exemplary process is shown for manufacturing a structure with variable filter structures resulting in optimized optical properties for layers above a particular photodiode such as, for example, the exemplary structure shown in FIG. 6F. At processing segment S221, an initial film stack is formed including a device stack 55 above photodiodes 52, 53, 54 which are emplaced on or above bulk silicon 51. At processing segment S223, color material is deposited on the device stack 55 to a predetermined depth which optimizes color layer (e.g., 91) for a particular wavelength of light which is incident to a selected photodiode surface (e.g., 53). At processing segment S225, the color material layer (e.g., 91) is formed into an extended filter layer over the selected photodiode (e.g., 53) by methods such as planarization. At processing segment S227, a determination is made of whether or not anther color is to be deposited and planarized. If another color is to be deposited on one or more portions of the imager, then processing segment S223 is accomplished and another color material layer (e.g., 93) is deposited on the device stack 55 and the color material which was previously formed on the device layer (e.g., 91) to a predetermined depth. At processing segment S225, the newly deposited color material layer (e.g., 93) is formed into an extended filter layer over the selected photodiode (e.g., 52). Processing continues from processing segment S223 to S227 until no additional color material layers are to be deposited then processing terminates.

Figure 7A:
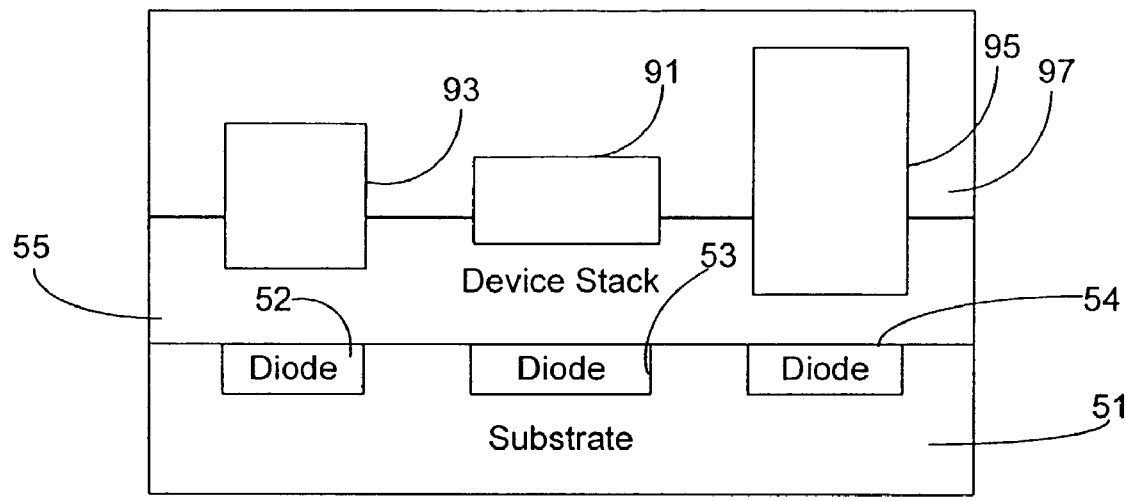
FIG. 7A shows a cross sectional view of a portion of a color pixel structure before processing in accordance with one exemplary embodiment of the invention.
Figure 7B:
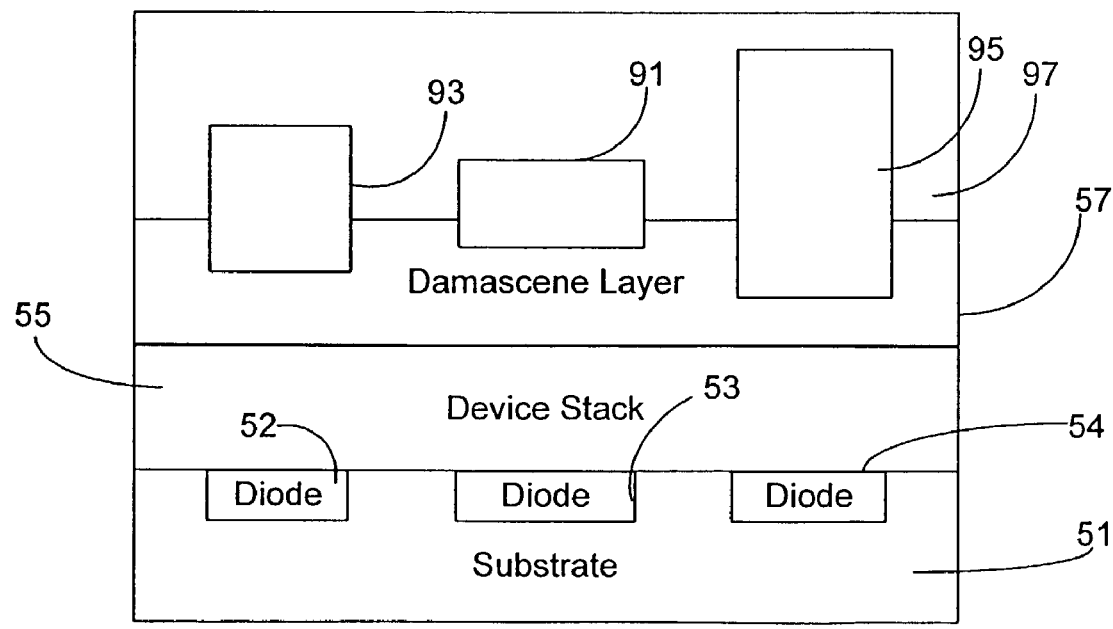
FIG. 7B shows a cross sectional view of the FIG. 6A color pixel and filter structure at a state of processing subsequent to that shown in FIG. 7A.
Figure 7C:
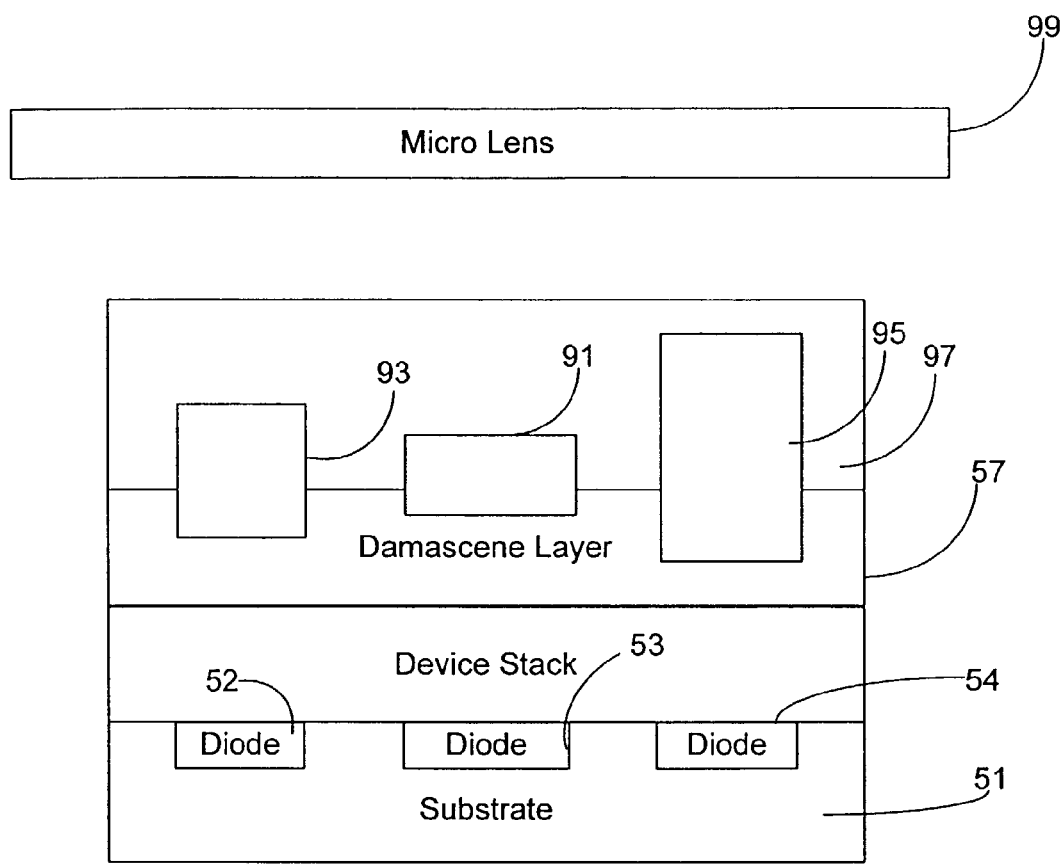
FIG. 7C shows a cross sectional view of the FIG. 6A color pixel and filter structure at a state of processing subsequent to that shown in FIG. 7B.

Referring to FIG. 7A, another exemplary embodiment is shown which combines multiple depths or dimensions of a color filter array element 93, 91 or 95 with varied location of a respective element with respect to a device layer 55 and a particular photodiode. FIG. 7B shows the use of a damascene layer 57 above the device layer 55 involving various dimensioned color filter elements 91, 93, 95 with extended damascene layers. Color filter element dimensions within damascene layer 57 are determined such that passage of a particular wavelength of light through the layers over a photodiode beneath an element is optimized. FIG. 7C shows how a micro lens 99 can be used over an exemplary embodiment which employs optimized color filter elements with a damascene layer. It should be noted that a micro lens 99 may be used with any of the exemplary embodiments of the invention described herein.

The sequence in which color filters are formed can be varied. For example, in some of the exemplary embodiments, red is formed, then green, then blue. However, the order of color filter formation is not limited to this sequence in this, or any other embodiments. It should also be noted that the encapsulation layers can be used with or without an embodiment of the invention to further tune and adjust the optical properties of an imager.

Various materials, coatings and dimensions of CFA windows can be used with the invention to optimize optical properties. An extended damascene layer can be formed, planed, then can be coated with a coating layer which is selected to provide selective alterations to the cumulative reflective and absorptive properties of the layers above a particular photodiode being tuned. It should be further noted that the invention is not limited to use of color filtering photo resist as material selection is not limited by ability to be imaged by light. Color filtering polymer material can also be used in place of color filtering photo resist.

The use of variable dimensioned CFA windows above either the device stack layer or photodiodes themselves provides a means for adjusting optical properties of an imager based on model data and collective layer properties. Optical properties include focal, absorptive thin film interference and refractive properties of the combined layers. Optimization effects include increasing light intensity for each wavelength incident to a particular diode. Each CFA window can also be designed to tune or optimize light intensity transmitted in different materials for different frequencies. In other words, the depths of the CFA windows are, in part, dependent on the refractive index of the dopants and filler implanted in the CFA windows. Accordingly, various depths of different materials can be used in order to obtain the appropriate effect or maximum intensity in the photo diode collection area.

Another aspect of the invention focuses on how different colors can be optimized so that each one is delivered with maximum efficiency through the substrate to the photodiode. Differently dimensioned materials can also include pigments or dye which is capable of optimized filtering through imager layers for a particular color. A color or dye can be formed into a cavity which has different optical path lengths that are compatible with the average wavelength expected to pass through the path as well as the imager substrate or stack above the photodiode. Tuning the stack thickness to minimize reflection and absorption in the stack for each wavelength range of interest increases the intensity of the light collected by a photodiode, usually red, green and blue or cyan magenta and yellow.

Figure 8:
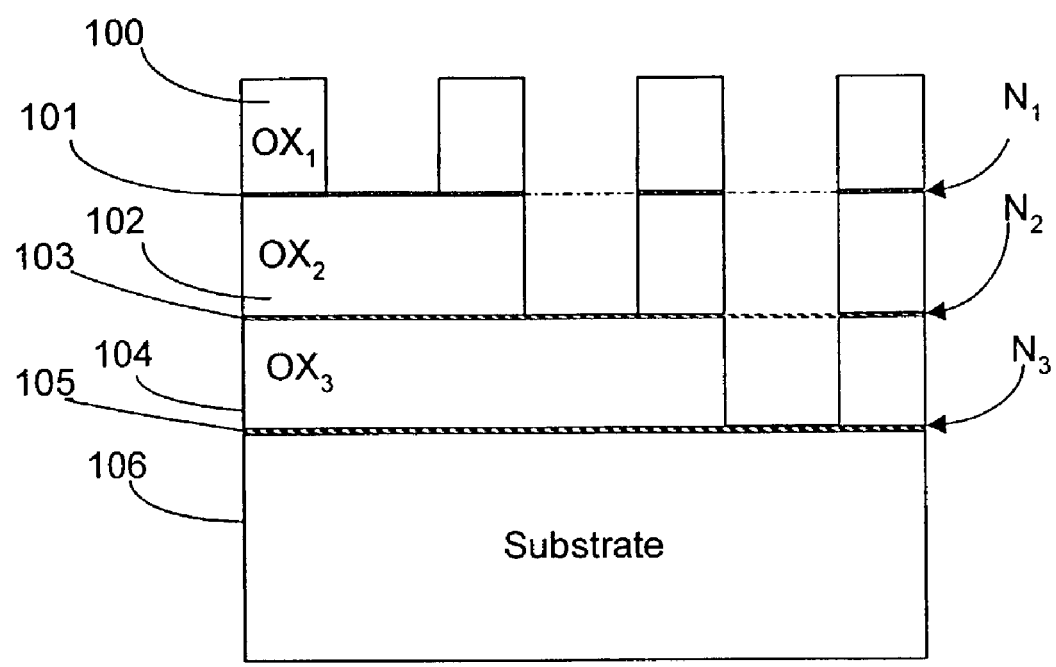
FIG. 8 shows a cross sectional view of an exemplary embodiment of a portion of a color pixel and filter structure showing exemplary layers in the structure.

A variety of etching strategies can be used with the invention. For example, referring to FIG. 8, a set of oxide layers, such as silicon dioxide, with various etch stops between oxide layers is provided. Etching can be done on the first oxide layer $OX_1$ 100 to the first etch stop $N_1$ 101. Then, the etching chemistry is switched to a different chemical etch to break through the $N_1$ 101 etch stop then the etching chemistry is switched to another chemical etch to etch through a second oxide layer $OX_2$ 102 until etch stop $N_2$ 103 is reached. Then, another switch is made to an etching chemistry which is capable of etching through the second etch stop $N_2$ 103 if necessary. Then, etching can be done to the third oxide layer $OX_3$ 105 to etch stop $N_3$ 105 which, in this example, is above bulk silicon 106 but could also be located in proximity to a photodiode or photo sensitive region. An initial film stack can include etch stops between each layer or selected layers. All three layers can be etched at the same time, then resulting cavities which have been etched to a maximum desired depth can be masked in order to proceed with etching if necessary. Different layers can be the same material or different materials which are sensitive to different etch chemistries, or selective etches of different oxides. Also, it is possible to perform one photo step and expose different layers.

Various thicknesses can be used with the different layers in different embodiments depending on what layer material is used. For example, if silicon nitride is used, a 500 Angstroms thickness can be used for the etch stop. If other materials are used, then thinner thicknesses may be permissible. Also, it is possible to use different materials with different oxide layers each having their own selective chemistries. If a selective etch is desired with a sensitivity to different etching chemistries, then an etching process which may be used includes exposing a layer to create cavities above all photodiodes at once, then etching all cavities at the first layer or depth at the same time, then mask the cavities which have reached a maximum desired depth, with or without etch stops. Then, if necessary, an etch stop can be etched through, then apply chemistry etching for a second layer to etch down to a desired depth or dimension. If necessary, the etching, chemistry switch, etching, masking and etching process can be repeated until each color filter cavity has been etched to a desired dimension.

Figure 9:
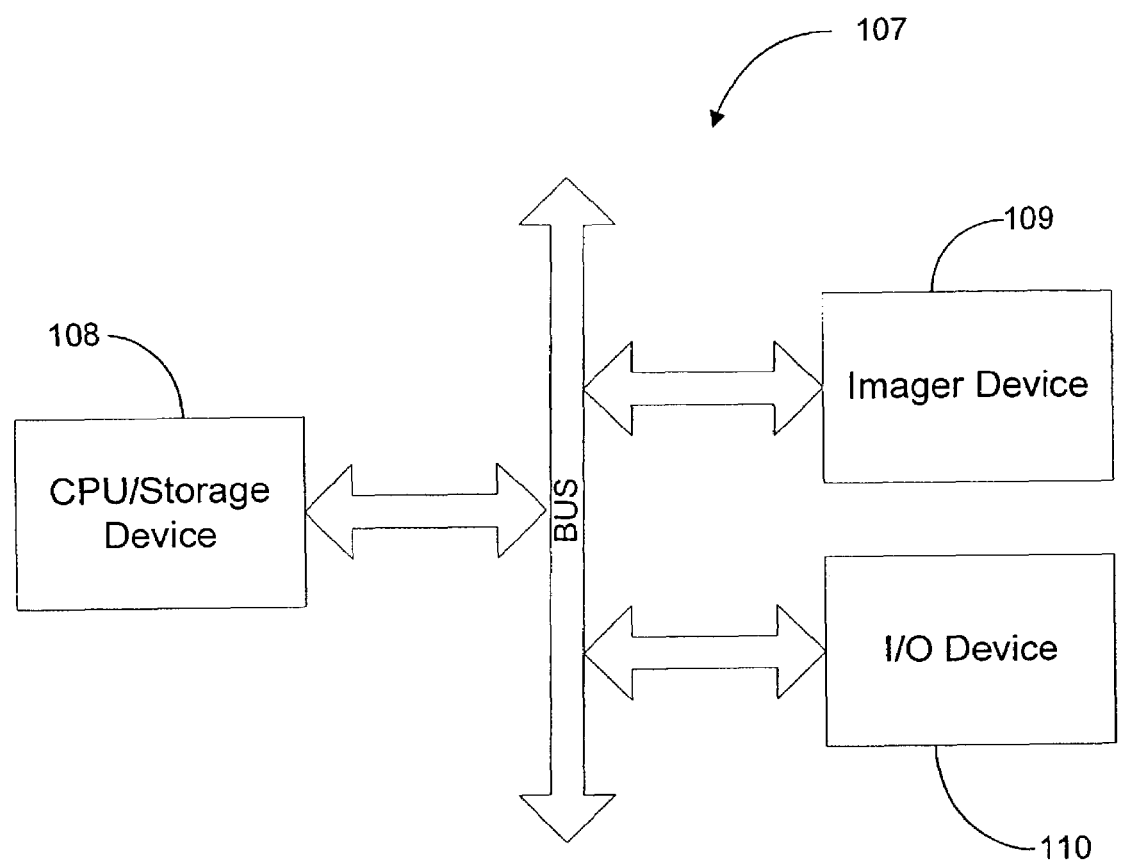
FIG. 9 shows an block diagram of a computer processor system incorporating an imager device having an array of pixels fabricated according to the present invention.

The pixel structure herein can be incorporated into an imager device having an array of pixels, at least one of the pixels being a pixel structure constructed according to the invention. The imager device 109 itself may be coupled to a processor 109 to form a processor system 107 as is shown in FIG. 9. Processor system 107 is exemplary of a system having digital circuits which could receive the output of an imager device 109, including a CMOS or CCD image device. Without being limiting, such a system can include a computer system, camera system, scanner, machine vision, vehicle navigation system, video phone, surveillance system, auto focus system, star tracker system, motion detection system, image stabilization system and data compression system for high definition television, all of which can utilize the present invention.

A processor based system, such as a computer system for example, generally comprises, in addition to an imager 109, a central processing unit and storage device 108, for example a microprocessor that communicates with one or more input/output devices 110. The imager communicates with the processor 108 over a bus or other conventional communication path. It may also be desirable to integrate the processor 108, image device 109 and any other required components, such as input/output device 110, onto a single chip.

Reference is made to various specific embodiments of the invention. These embodiments are described with sufficient detail to enable those skilled in the art to practice the invention. It is to be understood that other embodiments of the invention may be employed and that structural and electrical changes may be made without departing from the scope or spirit of the present invention.

What is claimed as new and desired to be protected by Letters Patent of the United States is:

1. An imaging device comprising:
    a plurality of photo sensitive regions for receiving incident light;
    a first layer comprising a matrix material formed above said plurality of photosensitive regions; and
    a plurality of filter regions formed in said first layer, each filter region comprising a plurality of discrete filters arranged above corresponding ones of said plurality of photo sensitive regions,
    wherein the discrete filters of each of said filter regions have a different combination of thickness and color filter material than the discrete filters of the other filter regions for selectively modifying optical characteristics of light passing through the filter regions and received by the photo sensitive regions, and
    wherein said matrix material is arranged to separate said discrete filters from each other.

2. An imaging device of claim 1 wherein said plurality of filter regions comprises first, second and third filter regions, and said plurality of photo sensitive regions comprises first, second and third photo sensitive regions for respectively receiving first, second and third incident light, said first filter region being configured for passing said first incident light, said second filter region is configured for passing said second incident light and said third filter region is configured for passing said third incident light.

3. An imaging device of claim 2 wherein said first filter region is optimized for a green wavelength of light, said second filter region is optimized for a red wavelength of light and said third filter region is configured for passing a blue wavelength of light.

4. An imaging device of claim 2 wherein said first filter region is configured for passing a cyan wavelength of light, said second filter region is configured for passing a magenta wavelength of light and said third filter region is configured for passing a yellow wavelength of light.

5. An imaging device of claim 2 wherein said discrete filters of said first, second and third filter regions have respective first, second and third thicknesses which are based in part on optimizing light received by said respective said first, second and third photo sensitive regions.

6. An imaging device of claim 2, wherein said first, second and third filter regions comprise color filter regions formed, respectively, of first, second and third photo sensitive color materials.

7. An imaging device of claim 6, wherein said first, second and third color filter regions comprise a color filtering photo resist.

8. An imaging device comprising:
    a plurality of color pixels for receiving incident light;
    at least one or more other layers formed on or around said plurality of color pixels;
    a damascene Ier formed above said at least one or more other layers; and
    a plurality of filter regions formed in said damascene layer, each filter region comprising a plurality of discrete filters arranged above corresponding ones of said plurality of color pixels,
    wherein the discrete filters of each of said filter regions have a different combination of thickness and color filter material than the discrete filters of the other filter regions for selectively modifying optical characteristics of light passing through the filter regions and received by the color pixels.

9. An imaging device of claim 8, wherein at least one of said filter regions comprises a photo lithographic material.

10. An imaging device of claim 8, wherein at least one of said filter regions are formed within previously defined openings in said damascene layer and in said one or more other layers.

11. An imaging device of claim 8 wherein said plurality of color pixels comprise first, second and third color pixels for respectively receiving first, second and third incident light, and said filter regions comprise first, second and third filter regions which are respectively configured for passing said first, second and third incident light.

12. An imaging device of claim 11 wherein said first filter region is configured for passing a green wavelength of light, said second filter region is configured for passing a red wavelength of light and said third filter region is configured for passing a blue wavelength of light.

13. An imaging device of claim 11 wherein said first filter region is configured for passing a cyan wavelength of light, said second filter region is configured for passing a magenta wavelength of light and said third filter region is configured for passing a yellow wavelength of light.

14. An imaging device of claim 11 wherein said discrete filters of said first, second and third filter regions have a respective first, second and third thickness for selectively altering the intensity of said incident light received by said first, second and third color pixels.

15. A color pixel array for an imaging device, said pixel array comprising:
a plurality of photo sensitive regions for receiving incident light;
a first layer comprising a matrix material formed above said photo sensitive regions; and
a plurality of filter regions formed in said first layer, each filter region comprising a plurality of discrete filters arranged above corresponding ones of said plurality of photo sensitive regions,
wherein the discrete filters of each of said filter regions have a different combination of thickness and color filter material than the discrete filters of the other filter regions for selectively modifying optical characteristics of light passing through the filter regions and received by the photo sensitive region, and
wherein said matrix material is arranged to separate said discrete filters from each other.

16. A color pixel of claim 15 wherein said plurality of filter regions comprises first, second and third filter regions, and said plurality of photo sensitive regions comprises first, second and third photo sensitive regions for respectively receiving first, second and third incident light, said first filter region being configured for passing said first incident light, said second filter region is configured for passing said second incident light and said third filter region is configured for passing said third incident light.

17. A color pixel of claim 16 wherein said first filter region is configured for passing a green wavelength of light, said second filter region is configured for passing a red wavelength of light and said third filter region is configured for passing a blue wavelength of light.

18. A color pixel of claim 16 wherein said first filter region is configured for passing a cyan wavelength of light, said second filter region is configured for passing a magenta wavelength of light and said third filter region is configured for passing a yellow wavelength of light.

19. A color pixel of claim 16 wherein said discrete filters of said first, second and third filter regions have a respective first, second and third thickness for optimizing the incident light received, respectively, by said first, second and third photo sensitive region.

20. An imaging device comprising:
a plurality of photo sensitive regions for receiving incident light;
a plurality of damascene layers formed respectively above said plurality of photo sensitive regions; and
a plurality of filter regions respectively formed above said plurality of damascene layers and said plurality of photo sensitive regions, each of said filter regions and said damascene layers having optical properties for modifying the optical properties of said incident light received by said respective photo sensitive region.

21. An imaging device of claim 20, wherein said plurality of filter regions comprises first, second and third filter regions, and said plurality of photo sensitive regions comprises first, second and third photo sensitive regions for respectively receiving first, second and third incident light, said first filter region being configured for passing said first incident light, said second filter region is configured for passing said second incident light and said third filter region is configured for passing said third incident light.

22. An imaging device of claim 21, wherein said first filter region is configured for passing a green wavelength of light, said second filter region is configured for passing a red wavelength of light and said third filter region is configured for passing a blue wavelength of light.

23. An imaging device of claim 21 wherein said first filter region is configured for passing a cyan wavelength of light, said second filter region is configured for passing a magenta wavelength of light and said third filter region is configured for passing a yellow wavelength of light.

24. An imaging device of claim 21 wherein said first, second and third filter regions have respective first, second and third dimensions for passing the incident light received by said first, second and third photo sensitive regions, respectively.

25. An imaging device comprising:
a plurality of photo sensitive regions for receiving incident light;
a plurality of material layers forming a device stack formed above said photo sensitive regions;
a plurality of filter regions formed on said device stack and above corresponding ones of said plurality of photo sensitive regions, and
an encapsulation material formed over said device stack and said plurality of filter regions,
wherein the discrete filters of each of said filter regions have a different combination of thickness and color filter material than the discrete filters of the other filter regions for selectively modifying optical characteristics of light passing through the filter regions and received by the photo sensitive regions.

26. An imaging device of claim 25 wherein said plurality of filter regions comprises first, second and third filter regions, and said plurality of photo sensitive regions comprises first, second and third photo sensitive regions for respectively receiving first, second and third incident light, said first filter region being configured for passing said first incident light, said second filter region is configured for passing said second incident light and said third filter region is configured for passing said third incident light.

27. An imaging device of claim 26 wherein said first filter region is configured for passing a green wavelength of light, said second filter region is configured for gassing a red wavelength of light and said third filter region is configured for passing a blue wavelength of light.

28. An imaging device of claim 26 wherein said first filter region is configured for passing a cyan wavelength of light, said second filter region is configured for gassing a magenta wavelength of light and said third filter region is configured for passing a yellow wavelength of light.

29. An imaging device of claim 26 wherein said discrete filters of said first, second and third filter regions have respective first, second and third thicknesses for passing light received by said first, second and third photo sensitive regions, respectively.

30. A color pixel for an imaging device, said pixel comprising:
- a plurality of photo sensitive regions for receiving incident light;
- a plurality of material layers forming a device stack formed above said photo sensitive regions;
- a plurality of filter regions formed above said device stack and above corresponding ones of said plurality of photo sensitive regions; and
- an encapsulation material formed over said device stack and said plurality of filter regions,
- wherein the discrete filters of each of said filter regions have a different combination of thickness and color filter material than the discrete filters of the other filter regions for selectively modifying optical characteristics of light passing through the filter regions and received by the photo sensitive regions.

31. A color pixel of claim 30 wherein said plurality of filter regions comprises first, second and third filter regions, and said plurality of photo sensitive regions comprises first, second and third photo sensitive regions for respectively receiving first, second and third incident light, said first filter region being configured for passing said first incident light, said second filter region is configured for passing said second incident light and said third filter region is configured for passing said third incident light.

32. A color pixel of claim 31 wherein said first filter region is configured for passing a green wavelength of light, said second filter region is configured for passing a red wavelength of light and said third filter region is configured for passing a blue wavelength of light.

33. A color pixel of claim 31 wherein said first filter region is configured for passing a cyan wavelength of light, said second filter region is configured for passing a magenta wavelength of light and said third filter region is configured for passing a yellow wavelength of light.

34. A color pixel of claim 31 wherein said discrete filters of said first, second and third filter regions have respective first, second and third thicknesses for passing the incident light received by said first, second and third photo sensitive regions, respectively.

35. A computer system comprising:
- a bus;
- a processor coupled to said bus;
- an input/output device coupled to said bus;
- an imaging device coupled to said bus and in communication with said processor and input/output device comprising:
- a plurality of photo sensitive regions for receiving incident light;
- a first layer comprising a matrix material formed above said plurality of photo sensitive regions; and
- a plurality of filter regions formed in said first layer, each filter region comprising a plurality of discrete filters arranged above corresponding ones of said plurality of photo sensitive regions,
- wherein the discrete filters of each of said filter regions have a different combination of thickness and color filter material than the discrete filters of the other filter regions for selectively modifying optical characteristics of light passing through the filter regions and received by the photo sensitive regions, and
- wherein said matrix material is arranged to separate said discrete filters from each other.

36. A computer system of claim 35 wherein said plurality of filter regions comprises first, second and third filter regions, and said plurality of photo sensitive regions comprises first, second and third photo sensitive regions for respectively receiving first, second and third incident light, said first filter region being configured for passing said first incident light, said second filter region is configured for passing said second incident light and said third filter region is configured for passing said third incident light.

37. A computer system of claim 36 wherein said first filter region is configured for passing a green wavelength of light, said second filter region is configured for passing a red wavelength of light and said third filter region is configured for passing a blue wavelength of light.

38. A computer system of claim 36 wherein said first filter region is configured for passing a cyan wavelength of light, said second filter region is configured for passing a magenta wavelength of light and said third filter region is configured for passing a yellow wavelength of light.

39. A computer system of claim 36 wherein said discrete filters of said first, second and third filter regions have respective first, second and third thicknesses which are based in part on optimizing light received by said respective said first, second and third photo sensitive regions.

40. A computer system of claim 36, wherein said first, second and third filter regions comprise color filter regions formed, respectively, of first, second and third photo sensitive color materials.

41. A computer system of claim 36, wherein said first, second and third color filter regions comprise a color filtering photo resist.

42. A computer system comprising:
- a bus;
- a processor coupled to said bus;
- an input/output device coupled to said bus;
- an imaging device coupled to said bus and in communication with said processor and input/output device comprising:
- a plurality of color pixels for receiving incident light;
- at least one or more other layers formed on or around said plurality of color pixel;
- a damascene layer formed above said at least one or more other layers; and
- a plurality of filter regions formed in said damascene layer, each filter region comprising a plurality of discrete filters arranged above corresponding ones of said plurality of color pixels,
- wherein the discrete filters of each of said filter regions have a different combination of thickness and color filter material than the discrete filters of the other filter regions for selectively modifying optical characteristics of light passing through the filter regions and received by the color pixels.

43. A computer system of claim 42 wherein said plurality of filter regions comprises first, second and third filter regions, and said plurality of color pixels comprise first, second and third color pixels for respectively receiving first, second and third incident light, said first filter region being configured for passing said first incident light, said second filter region is configured for passing said second incident light and said third filter region is configured for passing said third incident light.

44. A computer system of claim 43 wherein said first filter region is configured for passing a green wavelength of light, said second filter region is configured for passing a red wavelength of light and said third filter region is configured for passing a blue wavelength of light.

45. A computer system of claim 43 wherein said first filter region is configured for passing a cyan wavelength of light, said second filter region is configured for passing a magenta wavelength of light and said third filter region is configured for passing a yellow wavelength of light.

46. A computer system of claim 43 wherein said discrete filters of said first, second and third filter regions have respective first, second and third thicknesses, and wherein at least one of said first, second and third filter regions extend into said at least one or more other layers.

47. A computer system of claim 43, wherein said first, second and third filter regions comprise color filter regions formed, respectively, of first, second and third photo sensitive color materials.

48. A computer system of claim 43, wherein said first, second and third color filter regions comprise a color filtering photo resist.

* * * * *

UNITED STATES PATENT AND TRADEMARK OFFICE
CERTIFICATE OF CORRECTION

PATENT NO. : 7,502,058 B2  Page 1 of 1
APPLICATION NO. : 10/456585
DATED : March 10, 2009
INVENTOR(S) : Hiatt et al.

It is certified that error appears in the above-identified patent and that said Letters Patent is hereby corrected as shown below:

In column 16, line 48, in Claim 8, delete "ler" and insert -- layer --, therefor.

In column 18, line 58, in Claim 27, delete "gassing" and insert -- passing --, therefor.

In column 18, line 63, in Claim 28, delete "gassing" and insert -- passing --, therefor.

Signed and Sealed this

Thirtieth Day of June, 2009

JOHN DOLL
*Acting Director of the United States Patent and Trademark Office*